US012663682B2

(12) United States Patent
Jeong et al.

(10) Patent No.: US 12,663,682 B2
(45) Date of Patent: Jun. 23, 2026

(54) DISPLAY DEVICE

(71) Applicant: LG Display Co., Ltd., Seoul (KR)

(72) Inventors: Min-Jae Jeong, Paju-si (KR); KiTaeg Shin, Paju-si (KR); Huijeong Kang, Paju-si (KR); Jinwoo Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 19/025,890

(22) Filed: Jan. 16, 2025

(65) Prior Publication Data

US 2025/0278002 A1    Sep. 4, 2025

(30) Foreign Application Priority Data

Feb. 29, 2024    (KR) ........................ 10-2024-0029837
Nov. 11, 2024    (KR) ........................ 10-2024-0159096

(51) Int. Cl.
| | |
|---|---|
| *G02F 1/1362* | (2006.01) |
| *G02F 1/1343* | (2006.01) |
| *G02F 1/1368* | (2006.01) |
| *G09G 3/36* | (2006.01) |
| *H10D 86/40* | (2025.01) |

(52) U.S. Cl.
CPC .. *G02F 1/136286* (2013.01); *G02F 1/134309* (2013.01); *G02F 1/1368* (2013.01); *G09G 3/3607* (2013.01); *G09G 3/3614* (2013.01); *H10D 86/441* (2025.01); *G09G 2300/0452* (2013.01); *G09G 2320/0233* (2013.01); *G09G 2320/0257* (2013.01)

(58) Field of Classification Search
CPC ......... G02F 1/136286; G02F 1/134309; G02F 1/1368; G09G 3/3614; G09G 3/3607; G09G 2300/0452; H10D 86/441
See application file for complete search history.

(56) References Cited

U.S. PATENT DOCUMENTS

| | | | | |
|---|---|---|---|---|
| 11,282,467 | B1 * | 3/2022 | Tu ........................ | G09G 3/3607 |
| 2016/0267862 | A1 * | 9/2016 | Yao ....................... | G09G 3/3685 |
| 2018/0108307 | A1 * | 4/2018 | Sakurai ................ | G09G 3/3648 |
| 2018/0366076 | A1 * | 12/2018 | Chi .................... | G02F 1/134309 |

FOREIGN PATENT DOCUMENTS

| | | | |
|---|---|---|---|
| KR | 10-2009-0020405 | A | 2/2009 |
| KR | 10-1341906 | B1 | 12/2013 |

* cited by examiner

*Primary Examiner* — Xuemei Zheng
(74) *Attorney, Agent, or Firm* — Birch, Stewart, Kolasch & Birch, LLP

(57) ABSTRACT

A display device can include first color subpixels arranged in a first row and disposed on a substrate, second color subpixels arranged in a second row and disposed on the substrate, and third color subpixels arranged in a third row and disposed on the substrate. Also, the display device can further include a first gate line disposed between the first row and the second row, the first gate line being connected to the first color subpixels arranged in the first row and a first group of subpixels among the second color subpixels arranged in the second row, and a second gate line disposed between the second row and the third row, the second gate line being connected a second group of subpixels among the second color subpixels arranged in the second row and the third color subpixels arranged in the third row.

27 Claims, 18 Drawing Sheets

Figure 6:
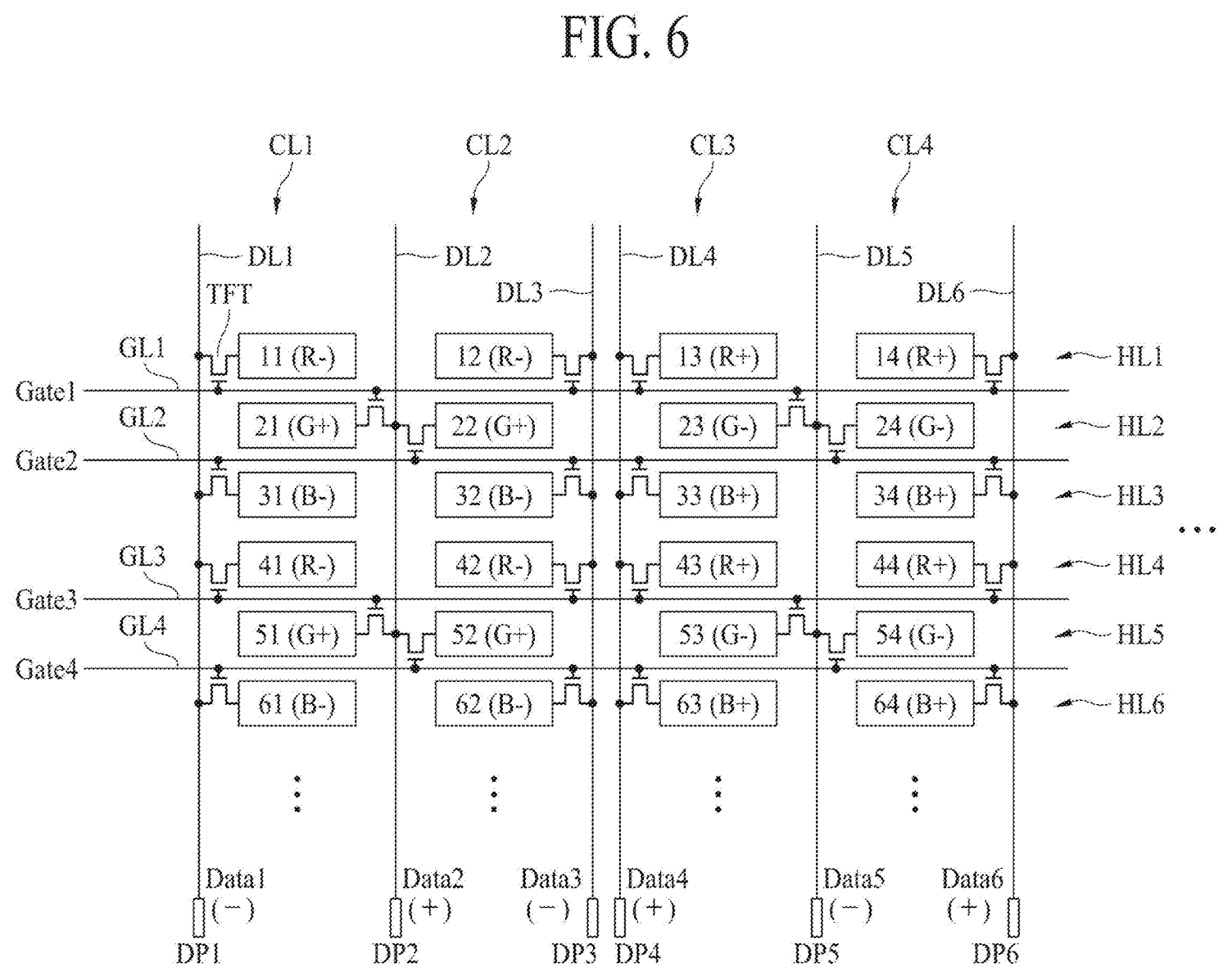

TFT

Gate1 GL1
Gate2 GL2
Gate3 GL3
Gate4 GL4

11 (R-) 12 (R-) 13 (R+) 14 (R+)
21 (G+) 22 (G+) 23 (G-) 24 (G-)
31 (B-) 32 (B-) 33 (B+) 34 (B+)
41 (R-) 42 (R-) 43 (R+) 44 (R+)
51 (G+) 52 (G+) 53 (G-) 54 (G-)
61 (B-) 62 (B-) 63 (B+) 64 (B+)

Data1 (−) DP1
Data2 (+) DP2
Data3 (−) DP3
Data4 (+) DP4
Data5 (−) DP5
Data6 (+) DP6

Odd Frame

Odd Frame

Even Frame

DISPLAY DEVICE

CROSS-REFERENCE TO RELATED APPLICATIONS

This application claims priority to the Korean Patent Applications No. 10-2024-0029837 filed in the Republic of Korea, on Feb. 29, 2024, and No. 10-2024-0159096 filed in the Republic of Korea, on Nov. 11, 2024, the entirety of all these applications being hereby incorporated by reference into the present application as if fully set forth herein.

BACKGROUND

Technical Field

The present disclosure relates to a display device capable of reducing manufacturing cost and power consumption.

Description of the Related Art

A liquid crystal display device includes a liquid crystal panel that displays an image through a pixel matrix using electrical and optical properties of liquid crystals with anisotropy such as refractive index and dielectric constant, a driving circuit that drives the liquid crystal panel, and a backlight unit that irradiates light to the liquid crystal panel.

Liquid crystal display devices are developing in the direction of reducing manufacturing cost and power consumption, and there is a need for a method to reduce manufacturing cost and power consumption without reducing resolution or impairing image quality. Also, there exists a need for a display device having a configuration that can reduce power consumption, reduce wiring to save space and increase lifespan of the device, while also being adapted to prevent image defects.

SUMMARY OF THE DISCLOSURE

The present disclosure provides a display device capable of improving a low grayscale stain or low grayscale image defect by compensating for a difference in luminance sensitivity by differently applying an S-factor of a driving transistor for each three-color subpixel.

The problems to be solved by embodiments of the present disclosure are not limited to those mentioned above, and other problems not mentioned above will be apparent to those skilled in the art to which the technical ideas of the present disclosure belong from the following descriptions.

To achieve these and other advantages and in accordance with the purpose of the disclosure, as embodied and broadly described herein, there is provided a display device according to an embodiment can include a first horizontal line including a plurality of first color subpixels arranged in a horizontal direction, a second horizontal line including a plurality of second color subpixels arranged in the horizontal direction, a third horizontal line including a plurality of third color subpixels arranged in the horizontal direction, a first gate line disposed between the first and second horizontal lines and connected to the first horizontal line and connected to some subpixels of the second horizontal lines, a second gate line disposed between the second and third horizontal lines and connected to the third horizontal line and connected to the remaining subpixels of the second horizontal lines, first to fourth column lines formed by alternately arranging the first to third color subpixels of the first to third horizontal lines in a vertical direction, a first data line disposed on a left side of the first column line and connected to the first and third color subpixels of the first column line, a third data line disposed on a right side of the second column line and connected to the first and third color subpixels of the second column line and a second data line disposed between the first and second column lines and connected to the first column line and the second color subpixel of the second column line.

In accordance with another aspect of the present disclosure, there is provided a display device according to an embodiment can include a first horizontal line including a plurality of first color subpixels arranged in a horizontal direction, a second horizontal line including a plurality of second color subpixels arranged in the horizontal direction, a third horizontal line including a plurality of third color subpixels arranged in the horizontal direction, a first gate line disposed between the first and second horizontal lines and connected to the first horizontal line and connected to some subpixels of the second horizontal lines, a second gate line disposed between the second and third horizontal lines and connected to the third horizontal line and connected to the remaining subpixels among the second horizontal lines, first to fourth column lines formed by alternately arranging the first to third color subpixels of the first to third horizontal lines in the vertical direction, a first data line disposed on the left side of the first column line and connected to the first and third color subpixels of the first column line, a (2-1)th data line disposed between the first and second column lines and connected to the second color subpixel of the first column line and a (3-1)th data line disposed between the first and second column lines and connected to the second color subpixel of the second column line, a fourth data line disposed between the second and third column lines and connected to the first and third color subpixels of the second column line and a fifth data line disposed between the second and third column lines and connected to the first and third color subpixels of the third column line, a (2-2)th data line disposed between the third and fourth column lines and connected to the second color subpixel of the third column line and a (3-2)th data line disposed between the third and fourth column lines and connected to the second color subpixel of the fourth column line, and a sixth data line disposed on the right side of the fourth column line and connected to the first and third color subpixels of the fourth column line, and the (2-1)th data line is connected to the 2-2 data line, and the (3-1)th data line is connected to the (3-2)th data line.

In accordance with other aspect of the present disclosure, there is provided a display device according to an embodiment, which can comprise a first horizontal line including first color subpixels arranged in a horizontal direction; a second horizontal line including second color subpixels arranged in the horizontal direction; a third horizontal line including third color subpixels arranged in the horizontal direction; a first gate line disposed between the first and second horizontal lines and connected to the first horizontal line and connected to some subpixels of the second horizontal line; a second gate line disposed between the second and third horizontal lines and connected to the third horizontal line and connected to remaining subpixels of the second horizontal line; column lines, each including alternating arrangements of the first to third color subpixels of the first to third horizontal lines in a vertical direction; first type data line disposed on a first side of each of the column lines and connected to first and third color subpixels of each of the column lines; and second type data lines disposed on a second side of each of the column lines and connected to second color subpixels of each of the column lines, wherein the second type of data line and the first type data line are disposed in parallel between adjacent column lines.

It is to be understood that both the foregoing general description and the following detailed description of the present disclosure are examples are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure, and are briefly described below.

FIG. 6 is a diagram illustrating an example of an inversion driving method of an even frame with respect to the liquid crystal panel illustrated in FIG. 4 according to an embodiment of the present disclosure.

FIG. 9 is a diagram illustrating an example of a pixel arrangement structure of a liquid crystal panel according to an embodiment of the present disclosure.

FIG. 10 is a diagram illustrating an example of an inversion driving method of an odd frame with respect to the liquid crystal panel illustrated in FIG. 9 according to an embodiment of the present disclosure.

FIG. 11 is a diagram illustrating an example of an inversion driving method of an even frame with respect to the liquid crystal panel illustrated in FIG. 9 according to an embodiment of the present disclosure.

FIG. 14 is a diagram illustrating an example of a pixel arrangement structure of a liquid crystal panel according to an embodiment of the present disclosure.

FIG. 16 is a diagram illustrating an example of an inversion driving method of an even frame with respect to the liquid crystal panel illustrated in FIG. 14.

DETAILED DESCRIPTION OF THE EMBODIMENTS

Figure 1:
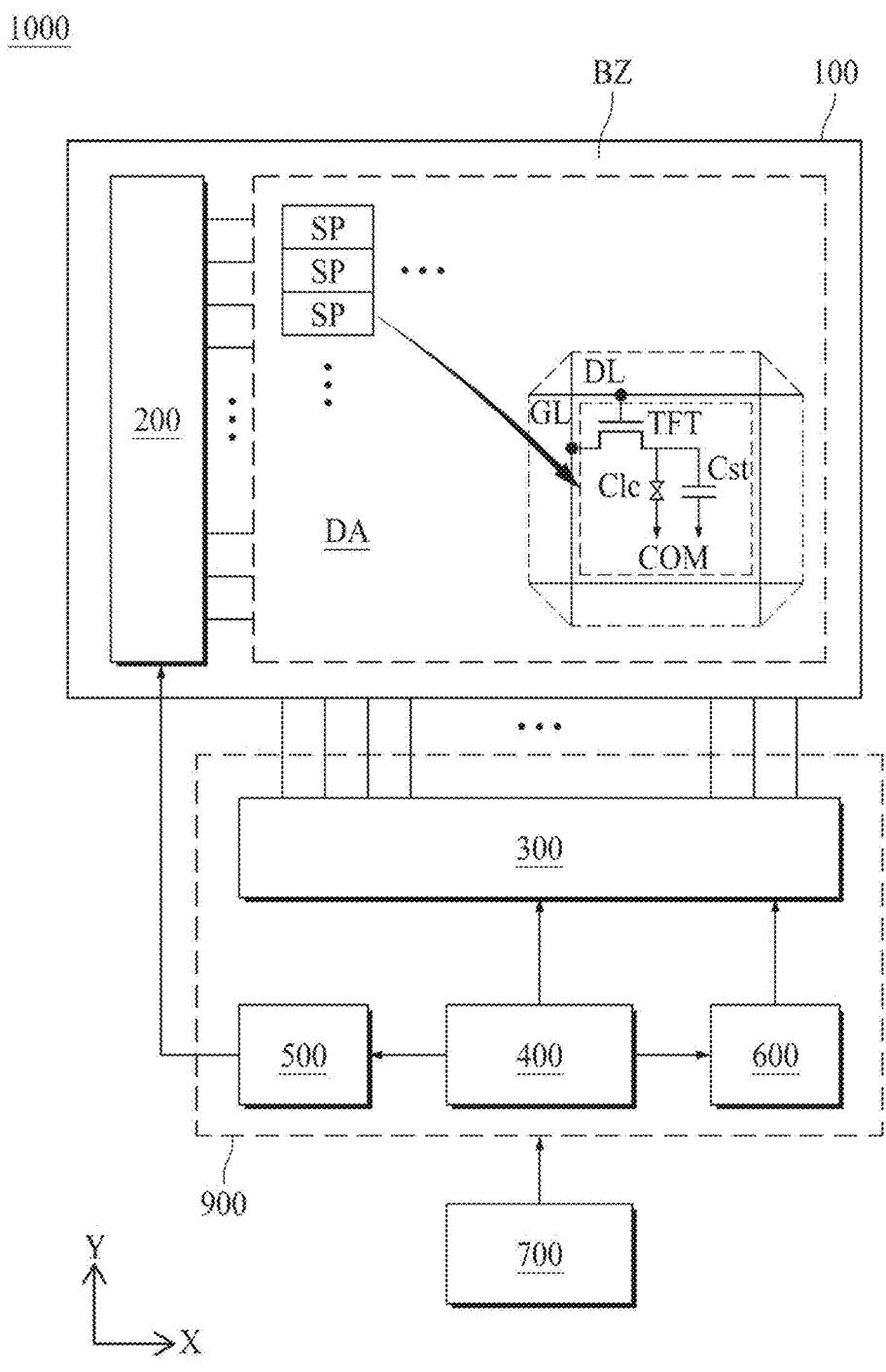
FIG. 1 is a block diagram illustrating a configuration of a display apparatus according to an embodiment of the present disclosure.

Advantages and features of the present disclosure, and implementation methods thereof will be clarified through the following embodiments, described with reference to the accompanying drawings. The present disclosure can, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the situation in which "comprise," "have," and "include" described in the present specification are used, another part can also be present unless "only" is used. The terms in a singular form can include plural forms unless noted to the contrary.

In construing an element, the element is construed as including an error region although there is no explicit description thereof.

In describing a positional relationship, for example, when the positional order is described as "on," "above," "below," "beneath," and "next," the situation of no contact therebetween can be included, unless "just" or "direct" is used.

If it is mentioned that a first element is positioned "on" a second element, it does not mean that the first element is essentially positioned above the second element in the figure. The upper part and the lower part of an object concerned can be changed depending on the orientation of the object. Consequently, the situation in which a first element is positioned "on" a second element includes the situation in which the first element is positioned "below" the second element as well as the situation in which the first element is positioned "above" the second element in the figure or in an actual configuration.

In describing a temporal relationship, for example, when the temporal order is described as "after," "subsequent," "next," and "before," a situation which is not continuous can be included, unless "just" or "direct" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element.

It should be understood that the term "at least one" includes all combinations related with any one item. For example, "at least one among a first element, a second element and a third element" can include all combinations of two or more elements selected from the first, second and third elements as well as each element of the first, second and third elements. Also, the term "can" includes all meanings and definitions of the term "may."

Features of various embodiments of the present disclosure can be partially or overall coupled to or combined with each other, and can be variously inter-operated with each other and driven technically. The embodiments of the present disclosure can be carried out independently from each other, or can be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode can be the drain electrode, and the drain electrode can be the source electrode. Also, the source electrode in any one embodiment of the present disclosure can be the drain electrode in another embodiment of the present disclosure, and the drain electrode in any one embodiment of the present disclosure can be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region can be a source electrode, and a drain region can be a drain electrode. Also, a source region can be a drain electrode, and a drain region can be a source electrode.

Figure 2:
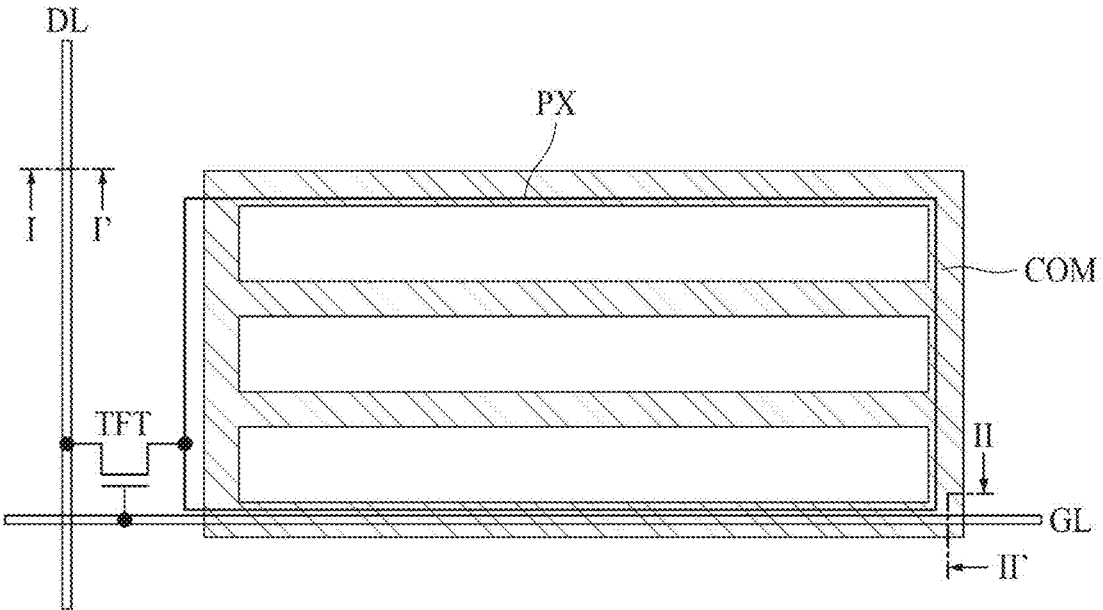
FIG. 2 is a diagram illustrating an example of a structure of a subpixel according to an embodiment of the present disclosure.
Figure 3A:
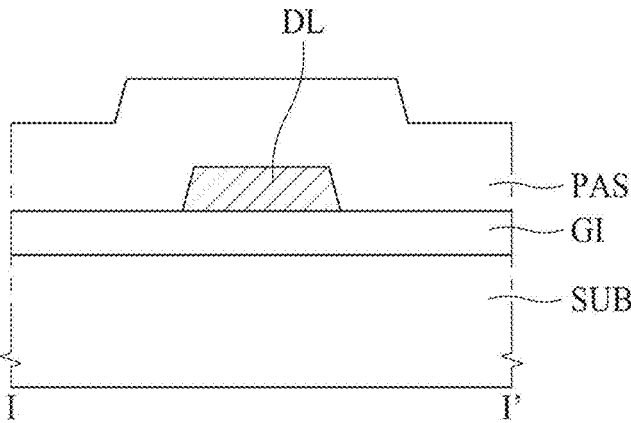
FIG. 3A is a cross-sectional view illustrating an example of a cross-sectional structure of a data line region along the line I-I' illustrated in FIG. 2 according to an embodiment of the present disclosure.
Figure 3B:
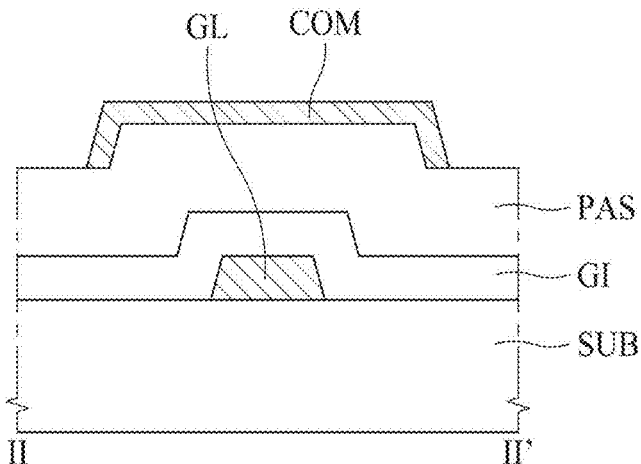
FIG. 3B is a cross-sectional view illustrating an example of a cross-sectional structure of a gate line region along the line II-II' illustrated in FIG. 2 according to an embodiment of the present disclosure.

FIG. 1 is a block diagram illustrating a configuration of a display device according to an embodiment of the present disclosure, FIG. 2 is a diagram illustrating an example of a subpixel structure according to an embodiment of the present disclosure, FIG. 3A is a cross-sectional view illustrating an example of a cross-sectional structure of a data line region along line I-I' shown in FIG. 2 according to an embodiment of the present disclosure, and FIG. 3B is a cross-sectional view illustrating an example of a cross-sectional structure of a gate line region along line II-II' according to an embodiment of the present disclosure.

Referring to FIG. 1, the display device 1000 can include a liquid crystal panel 100, a driving circuit 900, and a power management circuit 700. The display device 1000 can further include a backlight unit disposed on a rear surface of the liquid crystal panel 100 to provide light to the display area DA of the liquid crystal panel 100, and a backlight driving circuit to drive the backlight unit. The driving circuit 900 can include a gate driving circuit 200 (e.g., gate driver), a data driving circuit 300 (e.g., data driver), a timing controller 400, a level shifter 500, a gamma voltage generator 600, etc., and the gate driving circuit 200 can be embedded in the liquid crystal panel 100 (e.g., a gate in panel GIP circuit).

The liquid crystal panel 100 can include a display area DA in which the subpixels SP are arranged in a matrix form, and a bezel area BZ surrounding the outer periphery of the display area DA. The display area DA of the liquid crystal panel 100 can display an image by including a plurality of pixels composed of three or four color subpixels SP that transmit light of different colors.

The liquid crystal panel 100 can include first and second substrates bonded with a liquid crystal layer interposed therebetween, and polarizing plates respectively attached to outer surfaces of the first and second substrates. A thin film transistor TFT of the subpixels SP, Signal lines and electrodes including a gate line GL, a data line DL, a pixel electrode PX (FIG. 2), etc. connected to the thin film transistor TFT, and circuits including the gate driving circuit 200 can be disposed on the first substrate. A common electrode COM can be disposed on any one of the first and second substrates. A black matrix and a color filter of the subpixels SP can be disposed on any one of the first and second substrates.

In an embodiment, the liquid crystal panel 100 can further include a touch sensor disposed to overlap with the display area DA to sense a user's touch. The touch sensor can be disposed on the display area DA of the liquid crystal panel 100, or can also use the divided common electrodes COM of the liquid crystal panel 100 as touch electrodes.

Each subpixel SP can be independently driven by a thin film transistor TFT connected to the gate line GL and the data line DL. Each subpixel SP can include a thin film transistor TFT connected to the gate line GL and the data line DL, a liquid crystal capacitor Clc connected in parallel to the thin film transistor TFT, and a storage capacitor Cst. The liquid crystal capacitor Clc can charge a difference voltage between the data signal supplied to the pixel electrode PX through the thin film transistor TFT and the common voltage supplied to the common electrode COM, and can control light transmittance by driving the liquid crystal according to the charged voltage. The storage capacitor Cst can serve to stably hold the voltage charged in the liquid crystal capacitor Clc while the thin film transistor TFT is turned off.

Each subpixel SP can adjust the light transmittance of the light transmitted through the liquid crystal panel 100 and the polarizing plate from the backlight unit by driving the liquid crystal according to the charged voltage to change the liquid crystal arrangement direction. Each subpixel SP can express a gray scale of an image by multiplying the brightness of the backlight unit and the light transmittance controlled by the data signal in each subpixel SP.

The liquid crystal layer of the liquid crystal capacitor Clc in each subpixel SP can be driven in twisted nematic (TN) mode or vertical alignment (VA) mode by a vertical electric field applied through the pixel electrode PX and the common electrode COM, can be driven in in-plane switching (IPS) mode by a horizontal electric field applied through the pixel electrode PX and the common electrode COM, or can be driven in Fringe Field Switching (FFS) mode by a fringe electric field applied through the pixel electrode PX and the common electrode COM.

In an embodiment, the pixel electrode PX and the common electrode COM of each subpixel SP can be overlapped with each other on the first substrate with an insulating layer interposed therebetween, can include a plurality of slits in which one of the pixel electrode PX and the common electrode COM overlaps with the other electrodes, and the liquid crystal layer can be driven in FFS mode by applying a fringe electric field to the liquid crystal layer.

Subpixels SP of different colors can be repeatedly arranged alternately in the vertical direction Y in the display area DA of the liquid crystal panel 100, and the subpixels SP of the same color can be arranged in the horizontal direction X.

In an embodiment, the red (R), green (G), and blue (B) subpixels SP can be repeatedly disposed alternately in the vertical direction Y, and the subpixels SP of the same color can be disposed along the horizontal direction X. In other words, each row of subpixels can be of a same color. Accordingly, the liquid crystal panel 100 according to an embodiment can reduce the number of data lines DL than compared to a liquid crystal panel of the related art in which the R, G, and B subpixels are alternately disposed in the horizontal direction X, and as a result, the number of data integrated circuit ICs included in the data driving circuit 300 can be reduced, thereby reducing the manufacturing cost of the display device 1000.

In an embodiment, a plurality of data lines DLs disposed in the display area DA of the liquid crystal panel 100 can include a first type data line connected to subpixels of different colors, and a second type data line connected to subpixels of the same color. A detailed description thereof will be described later.

The liquid crystal panel 100 according to an embodiment can use two gate lines to drive an R horizontal line including a plurality of R subpixels, a G horizontal line including a plurality of G subpixels, and a B horizontal line including a plurality of B subpixels by a double rate driving manner. Accordingly, the liquid crystal panel 100 according to an embodiment can reduce the number of gate lines GL than compared to the number of R, G, and B horizontal lines, and as a result, the manufacturing cost of the display device 1000 can be reduced. In other words, the liquid crystal panel 100 can have fewer gate lines GL than there are rows of subpixels (e.g., some of the subpixels in two adjacent horizontal rows of subpixels can share a same gate line). Also, for example, some of the subpixels in a horizontal row can be connected to one gate line while remaining subpixels in that same horizontal row can be connected to another gate line (e.g., one row of subpixels can be dividedly connected to two different gate lines).

In an embodiment, each subpixel SP can have a horizontal stripe shape including a long side parallel to the horizontal direction X, which is an extension direction of the gate line GL, and a short side parallel to the vertical direction Y, which is an extension direction of the data line DL.

Referring to FIG. 2, a thin film transistor TFT of a subpixel SP according to an embodiment can be connected to a gate line GL in a horizontal direction X, a data line DL in a vertical direction Y, and a pixel electrode PX. The common electrode COM can be disposed to overlap with the pixel electrode PX with at least one insulating layer interposed therebetween, and can include a plurality of slits overlapping the pixel electrode PX. The pixel electrode PX and the common electrode COM can have a long side in a horizontal direction X and a short side in a vertical direction Y. The common electrode COM can overlap with the gate line GL with a plurality of insulating layers interposed therebetween.

Referring to FIG. 3A, the data line DL can be disposed on the gate insulating layer GI on the first substrate SUB, and can be covered by the passivation layer PAS (e.g., without being overlapped by the common electrode COM).

Referring to FIG. 3B, the gate line GL can be disposed on the first substrate SUB and can be covered by the gate insulating layer GI. The common electrode COM can overlap with the gate line GL with the gate insulating layer GI and the passivation layer PAS stacked on the gate line GL interposed therebetween. Accordingly, the liquid crystal panel 100 according to an embodiment can reduce the parasitic capacitance load of the data line DL than to compared to a liquid crystal panel of the related art to which the data line and the common electrode overlap with each other with a common electrode having a passivation layer interposed therebetween. In other words, according to an embodiment the data lines can be spaced apart from the common electrode COM so that they do not overlap with each other, in order to reduce parasitic capacitance.

Therefore, the liquid crystal panel 100 according to an embodiment of the present disclosure can reduce power consumption by reducing the load on the data line DL, and can prevent image quality defects by reducing a ripple effect of the common voltage.

A plurality of transistors disposed in the display area DA of the liquid crystal panel 100 and the bezel area BZ including the gate driving circuit 200 can include an LTPS transistor using a low temperature polysilicon (LTPS) semiconductor or an oxide transistor using a metal-oxide semiconductor.

The gate driving circuit 200 can be disposed in any one of both bezel areas BZ facing with the display area DA interposed therebetween in the liquid crystal panel 100, or can be disposed in both bezel areas BZ. The gate driving circuit 200 can be embedded in the bezel area BZ in a gate in panel (GIP) type including thin film transistors formed in the same process as the thin film transistor TFT of the display area DA.

The gate driving circuit 200 can operate by receiving a plurality of gate control signals supplied through the level shifter 500 from the timing controller 400. The gate driving circuit 200 can receive a plurality of gate control signals from the timing controller 400. The gate driving circuit 200 can be controlled by a plurality of gate control signals and can individually drive the gate lines GL of the liquid crystal panel 100. The gate driving circuit 200 can output a scan signal of a gate-on voltage to the corresponding gate line GL during a driving period of each gate line GL, and can output a gate-off voltage to the corresponding gate line GL during a non-driving period of each gate line GL.

The level shifter 500 can receive control signals from the timing controller 400 to generate a plurality of gate control signals by level shifting or logic processing them and output the plurality of gate control signals to the gate driving circuit 200.

The gamma voltage generator 600 can generate a plurality of reference gamma voltages having different voltage levels and output the generated gamma voltages to the data driving circuit 300. The gamma voltage generator 600 can generate a plurality of reference gamma voltages corresponding to gamma characteristics of the display device under the control of the timing controller 400 and output the generated gamma voltages to the data driving circuit 300. The gamma voltage generator 600 can be configured as a programmable gamma integrated circuit IC, and can generate or adjust the reference gamma voltages according to gamma data supplied from the timing controller 400 and output the generated gamma voltages to the data driving circuit 300.

The data driving circuit 300 can convert digital data received from the timing controller 400 with data control signals into analog data signals to supply data signals to the data line DL of the liquid crystal panel 100. The data driving circuit 300 can subdivide the plurality of reference gamma voltages supplied from the gamma voltage generator 600 to convert digital data into analog data voltages by using the subdivided gamma voltages. The data driving circuit 300 can determine the polarity of the data voltage according to the polarity control signal. The data driving circuit 300 can determine a data voltage by using a column inversion method in which the polarities of the adjacent data lines DL are opposite to each other and output the data voltage to the plurality of data lines DL.

The data driving circuit 300 can include at least one data integrated circuit IC. The data IC can be embedded in the bezel area BZ of the liquid crystal panel 100 or can be embedded in a circuit film to be connected to the liquid crystal panel 100.

The timing controller 400 can receive a source image and timing control signals from an external host system. The host system can be any one of a system of a portable terminal, such as a computer, a TV system, a set-top box, a tablet, or a mobile phone, etc. The timing control signals can include a dot clock, a data enable signal, a vertical synchronization signal, and a horizontal synchronization signal, etc.

The timing controller 400 can control the gate driving circuit 200 and the data driving circuit 300 using timing control signals supplied from the host system and timing setting information stored therein. The timing controller 400 can generate a plurality of gate control signals for controlling driving timing of the gate driving circuit 200 and output the generated gate control signals to the gate driving circuit 200. The timing controller 400 according to an embodiment can generate control signals for timing control and output the generated control signals to the level shifter 500, so that the level shifter 500 can generate a plurality of gate control signals and supply the same to the gate driving circuit 200. The timing controller 400 can generate a plurality of data control signals for controlling driving timing of the data driving circuit 300 and output the generated data control signals to the data driving circuit 300.

The timing controller 400 can perform various image processing including luminance correction or the like for power consumption reduction by using input image data, and can output the image-processed data to the data driving circuit 300. For example, the timing controller 400 can perform overdrive processing in which an overshoot value or an undershoot value according to a pixel data difference between adjacent frames is added to each pixel data to improve a response speed of the liquid crystal. The timing controller 400 can align the image-processed data according to the subpixel arrangement of the liquid crystal panel 100 and output the aligned data to the data driving circuit 300.

The power management circuit 700 can generate and supply a plurality of driving voltages required for driving the driving circuit 900 and the liquid crystal panel 100. The power management circuit 700 can generate and supply a gate-on voltage and a gate-off voltage to the gate driving circuit 200 of the liquid crystal panel 100, and can generate and supply a common voltage to the common electrode COM of the liquid crystal panel 100. The power management circuit 700 can generate and supply a plurality of driving voltages required for operations of the data driving circuit 300, the timing controller 400, the level shifter 500, and the gamma voltage generator 600.

Figure 4:
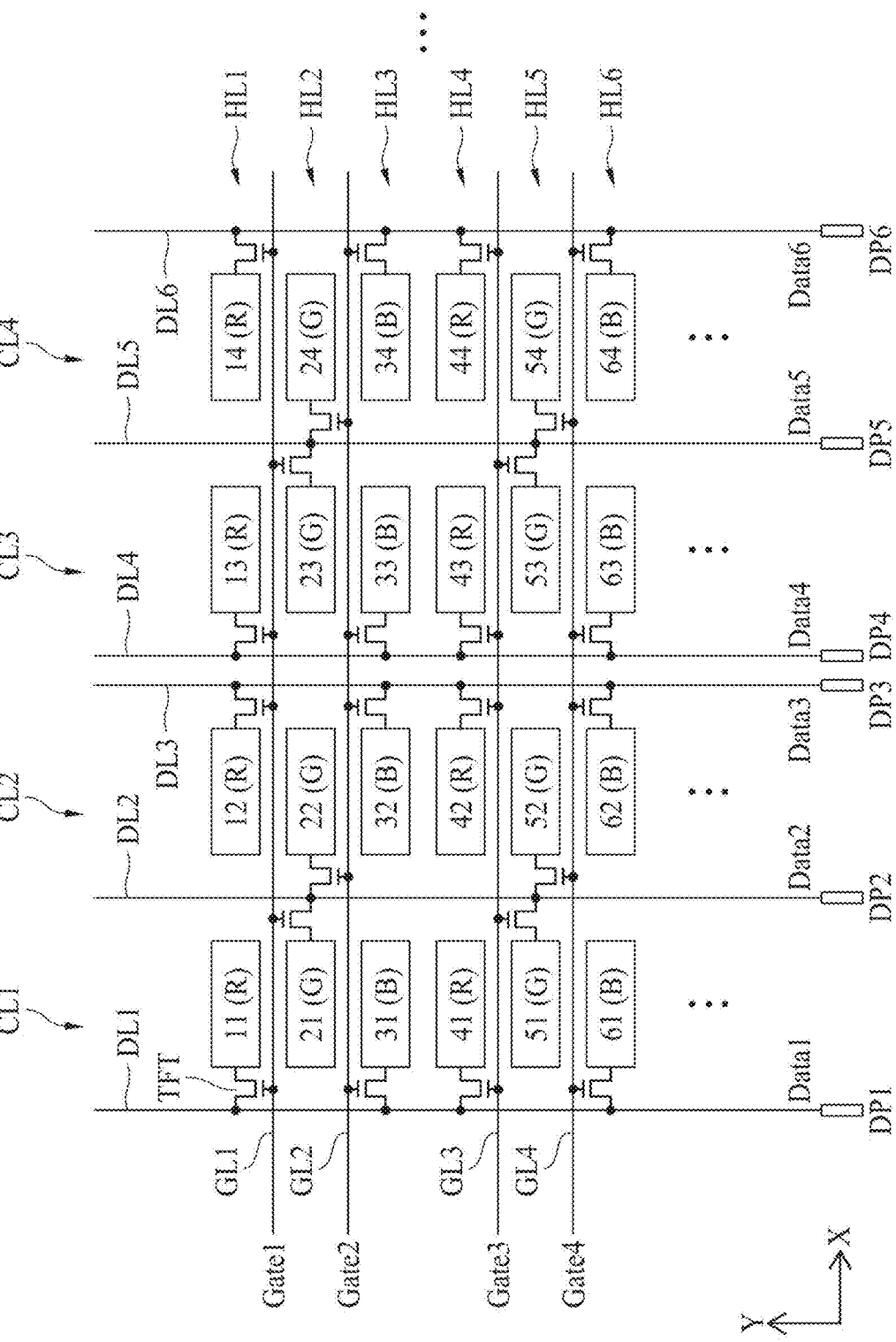
FIG. 4 is a diagram illustrating an example of a pixel arrangement structure of a liquid crystal panel according to an embodiment of the present disclosure.

FIG. 4 is a diagram illustrating an example of a pixel arrangement structure of a liquid crystal panel according to an embodiment.

Referring to FIG. 4, a display area of a liquid crystal panel according to an embodiment can include a pixel matrix including a plurality of horizontal lines HL1 to HL6 . . . composed of a plurality of subpixels arranged in the horizontal direction X and a plurality of column lines CL1 to CL4 . . . composed of a plurality of subpixels arranged in the vertical direction Y. Hereinafter, an arrangement structure of the first to sixth horizontal lines HL1*a* to HL6*a* and the first to fourth column lines CL1 to CL4 in the pixel matrix will be described as an example. For example, some of the gate lines can be shared by some subpixels among two adjacent rows of subpixels, which can reduce wiring, reduce power consumption, improve manufacturing efficiency and save space to provide higher resolutions.

Each of the column lines CLn (where n=1, 2, 3, 4) includes first to third color subpixels alternately arranged in the vertical direction Y (e.g., RGB repeating), and each of the horizontal lines HLm (where m=1, 2, 3, 4, 5, 6) includes subpixels of the same color arranged in the horizontal direction X. The 3m-2th horizontal line HL3*m*-2 (e.g., HL1, and HL4) includes first color subpixels (e.g., red), the 3m-1th horizontal lines HL3*m*-1 (e.g., HL2, and HL5) includes second color subpixels (e.g., green), and the 3mth horizontal lines HL3*m* (e.g., HL3, and HL6) includes third color subpixels (e.g., blue). For example, the first color, the second color, and the third color subpixels can be R, G, and B subpixels, but embodiments are not limited thereto.

The first to sixth horizontal lines HL1-HL6 and the first to fourth column lines CL1-CL4 can be driven by using the first to fourth gate lines GL1-GL4 and the first to sixth data lines DL1-DL6. For example, the number of gate lines is less than the number of rows of subpixels.

The gate lines GL1 to GL4 can extend in the horizontal direction X and can be disposed in parallel in the vertical direction Y. The gate lines GL1 to GL4 can be sequentially driven by receiving the gate signals Gate1 to Gate4 from the gate driving circuit 200 (FIG. 1).

The first to third horizontal lines HL1, HL2, and HL3 can be driven at a double rate driving manner by the first and second gate lines GL1 and GL2, and the fourth to sixth horizontal lines HL4, HL5, and HL6 can be driven at a double rate driving manner by the third and fourth gate lines GL3 and GL4. Accordingly, the display device according to an embodiment can reduce the number of gate lines to be less than the number of horizontal lines.

The first horizontal line HL1 and the third horizontal line HL3 can be driven by the first gate line GL1 and the second gate line GL2, respectively. The second horizontal line HL2 can be dividedly driven by the first and second gate lines GL1 and GL2. In other words, some of the subpixels in the second horizontal line HL2 can be controlled by the first gate line GL1 and the remaining subpixels in the second horizontal line HL2 can be controlled by the second gate line GL2.

The TFTs of the R subpixels 11, 12, 13, and 14 of the first horizontal line HL1 can be connected to the first gate line GL1 disposed between the first and second horizontal lines HL1 and HL2. The TFTs of the B subpixels 31, 32, 33, and 34 of the third horizontal line HL3 can be connected to the second gate line GL2 disposed between the second and third horizontal lines HL2 and HL3. The TFTs of the G subpixels 21 and 23 of the odd column lines CL1 and CL3 of the second horizontal line HL2 can be connected to the first gate line GL1, and the TFTs of the G subpixels 22 and 24 of the even column lines CL2 and CL4 of the second horizontal line HL2 can be connected to the second gate line GL2.

In the same manner, the fourth to sixth horizontal lines HL4, HL5, and HL6 can be connected to the third and fourth gate lines GL3 and GL4. In other words, every group of two gate lines can control a corresponding group of three rows of subpixels (e.g., GL1 and GL2 for HL1, HL2 and HL3, and GL3 and GL4 for HL4, HL5 and HL6, and so on).

The data lines DL1 to DL6 can extend in the vertical direction Y to cross the gate lines GL1 to GL4, and can be arranged side by side in the horizontal direction X. The data lines DL1 to DL6 can be individually supplied with the data signals Data1 to Data6 through the data pads DP1 to DP6 connected to the output channel of the data driving circuit 300 (FIG. 1) from the data driving circuit 300 (FIG. 1).

The first and second column lines CL1 and CL2 can receive data signals Data1, Data2, and Data3 through the first to third data lines DL1, DL2, and DL3, and the third and fourth column lines CL3 and CL4 can receive data signals Data4, Data5, and Data6 through the fourth to sixth data lines DL4, DL5, and DL6. For example, every group of three adjacent data lines can control a corresponding group of two columns of subpixels (e.g., DL1, DL2 and DL3 for CL1 and CL2, and DL4, DL5 and DL6 for CL3 and CL, and so on).

The TFTs of the R, B subpixels 11, 31, 41, and 61 of the first column line CL1 can be connected to a first data line DL1 disposed on the left side of the first column line CL1. The R, B subpixels 12, 32, 42, and 62 of the second column line CL2 can be connected to a third data line DL3 disposed on the right side of the second column line CL2. The TFTs of the G subpixels 21, 51, 22, and 52 of the first and second column lines CL1, and CL2 can be connected to a second data line DL2 disposed between the first and second column lines CL1, and CL2.

In the same manner, the third and fourth column lines CL3 and CL4 can be connected to the fourth to sixth data lines DL4, DL5 and DL6.

One data line DL2 can be disposed between the first and second column lines CL1 and CL2, and two data lines DL3 and DL4 can be disposed between the second and third column lines CL2 and CL3. One data line DL5 can be disposed between the third and fourth column lines CL3 and CL4, and two data lines DL6 and DL7 can be disposed between the fourth and fifth column lines CL4 and CL5. One data line can be disposed between column lines adjacent to each other in the horizontal direction X, or two data lines can be disposed, and an arrangement structure of one data line and an arrangement structure of two data lines can be alternately repeated in the horizontal direction X.

The data lines DL1 to DL6 can include first type data lines DL1, DL3, DL4, and DL6 connected to R and B subpixels of each of the column lines CLn (where n=1, 2, 3, and 4) to supply R and B data signals, and second type data lines DL2 and DL5 connected to G subpixels of each of the column lines CLn (where n=1, 2, 3, and 4) to supply G data signals. The second type data lines DL2 and DL5 can prevent luminance deviation of the same color by preventing a difference in the amount of charged data of the same color due to a difference in the type of data lines by supplying data signals of the same color. For example, each of the first type data lines can be connected to one column of subpixel for supplying data to red and blue subpixels, while the each of the second type data lines can be mixed or alternately connected between two adjacent columns of subpixels for supplying data to green subpixels, but embodiments are not limited thereto.

By driving the column inversion method of the data driving circuit 300 (FIG. 1), the polarities of the data signals Data1, Data3, and Data5 of the odd data lines DL1, DL3, and DL5 and the polarities of the data signals Data2, Data4, and Data6 of the even data lines DL2, DL4, and DL6 can be opposite to each other and can be reversed for each frame, which can extend the lifespan of the device and improve image quality.

Figure 5:
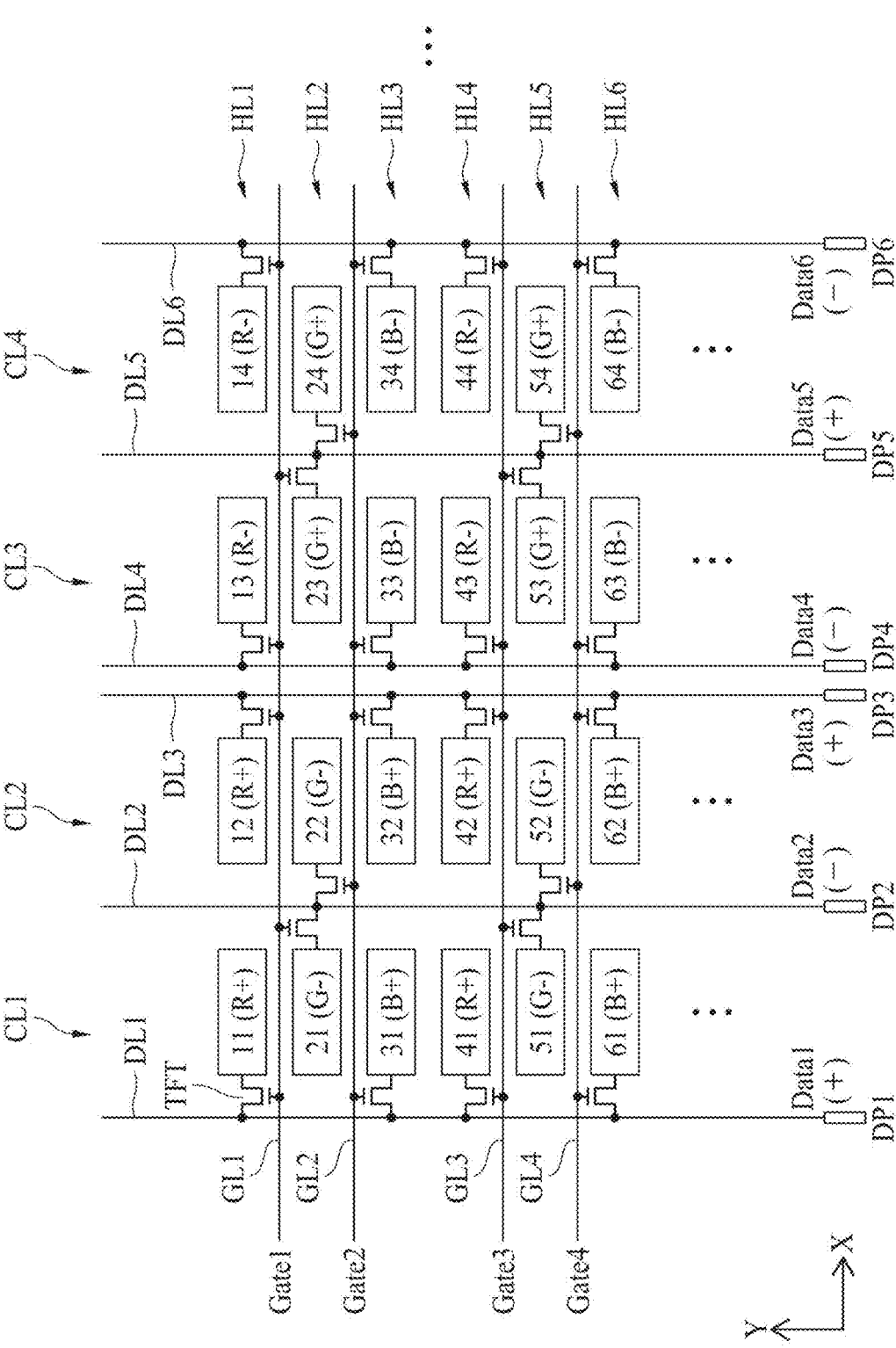
FIG. 5 is a diagram illustrating an example of an inversion driving method of an odd frame with respect to the liquid crystal panel illustrated in FIG. 4 according to an embodiment of the present disclosure.
Figure 7:
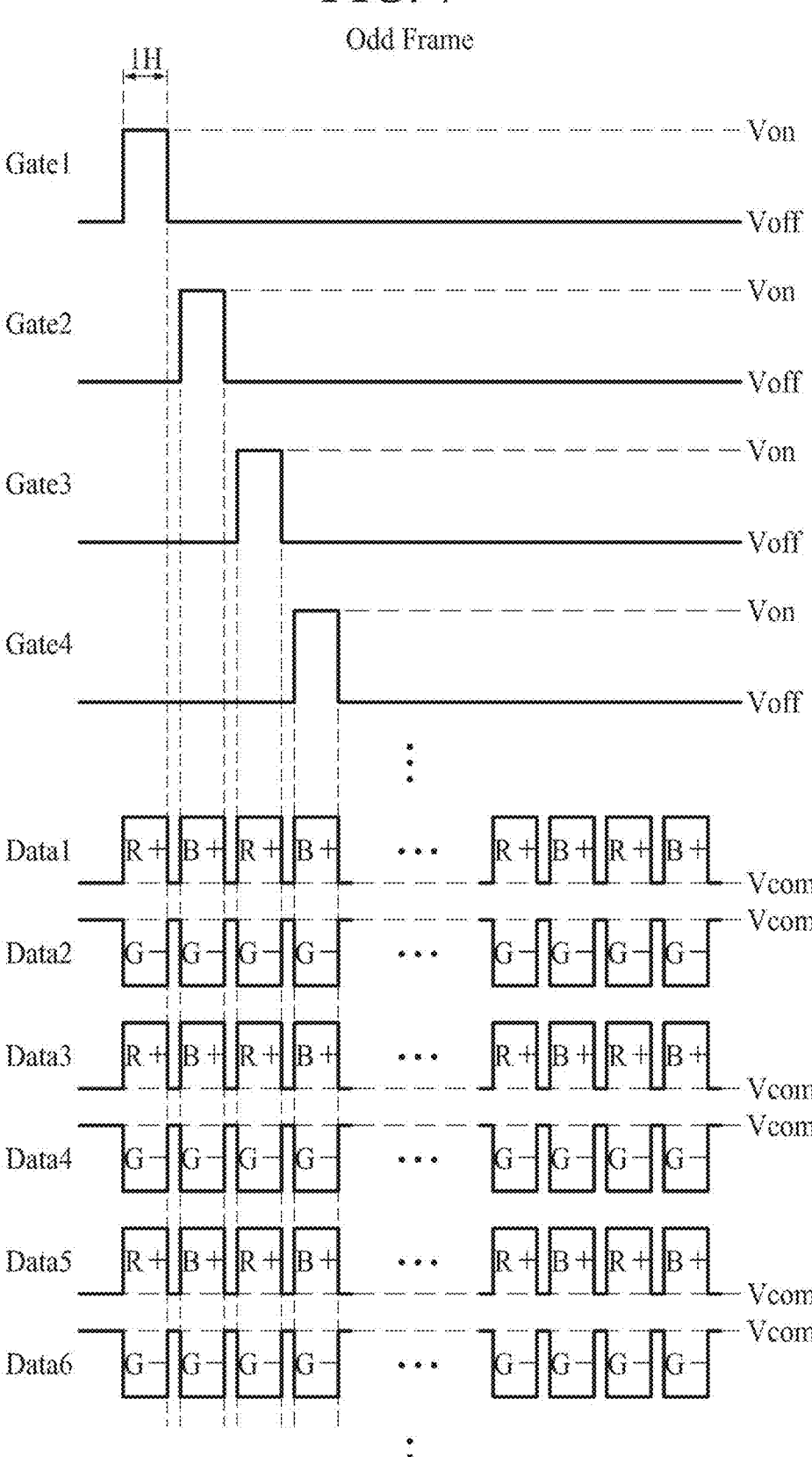
FIG. 7 is an example of a driving waveform diagram of an odd frame with respect to the liquid crystal panel illustrated in FIG. 5 according to an embodiment of the present disclosure.
Figure 8:
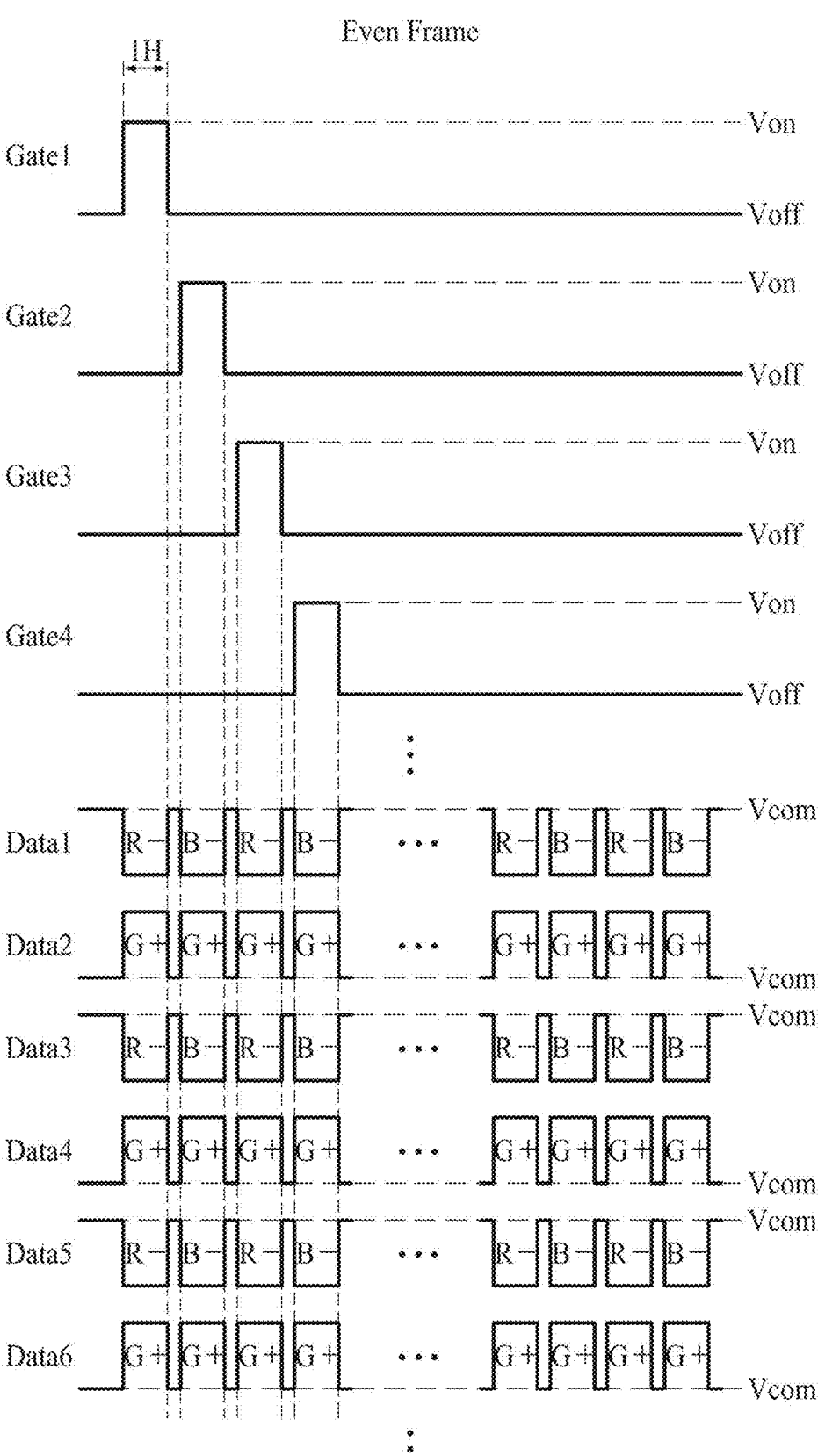
FIG. 8 is an example of a driving waveform diagram of an even frame with respect to the liquid crystal panel illustrated in FIG. 6 according to an embodiment of the present disclosure.

FIG. 5 is a diagram illustrating an example of an inversion driving method of an odd frame for a liquid crystal panel illustrated in FIG. 4 according to an embodiment of the present disclosure, FIG. 6 is a diagram illustrating an example of an inversion driving method of an even frame for a liquid crystal panel illustrated in FIG. 4 according to an embodiment of the present disclosure, FIG. 7 is an example of a driving waveform diagram of an odd frame for a liquid crystal panel illustrated in FIG. 5 according to an embodiment of the present disclosure, and FIG. 8 is an example of a driving waveform diagram of an even frame for a liquid crystal panel illustrated in FIG. 6 according to an embodiment of the present disclosure.

Referring to FIGS. 5 and 7, in the odd frame (the first frame), the first to fourth gate lines GL1 to GL4 can be sequentially driven for each horizontal period 1H by the gate-on voltage VON of the first to fourth gate signals Gate1 to Gate4 outputted from the gate driving circuit 200 (FIG. 1), and can receive the gate-off voltage VOFF. The first to sixth data lines DL1 to DL6 can supply first to sixth data signals Data1 to Data6 outputted from the data driving circuit 300 (FIG. 1). During the odd frame, the odd data lines DL1, DL3, and DL5 can supply the positive data signals Data1, Data3, and Data5, and the even data lines DL2, DL4, and DL6 can supply the negative data signals Data2, Data4, and Data6.

During a first horizontal period in which the gate-on voltage VON is supplied to the first gate line GL1 in the odd frame, the R subpixels 11, 12, 13, and 14 of the first horizontal line HL1 can charge the R+, R+, R−, and R− data signals supplied through the first, third, fourth, and sixth data lines DL1, DL3, DL4, and DL6, respectively, and the first and third G subpixels 21 and 23 of the second horizontal line HL2 can charge the G− and G+ data signals supplied through the second and fifth data lines DL2 and DL5, respectively.

During the second horizontal period in which the gate-on voltage VON is supplied to the second gate line GL2, the B subpixels 31, 32, 33, and 34 of the third horizontal line HL3 can charge the B+, B+, B−, and B− data signals supplied through the first, third, fourth, and sixth data lines DL1, DL3, DL4, and DL6, respectively, and the second and fourth G subpixels 22 and 24 of the second horizontal line HL2 can charge the G− and G+ data signals supplied through the second and fifth data lines DL2 and DL5, respectively.

During the third horizontal period in which the gate-on voltage VON is supplied to the third gate line GL3, the R subpixels 41, 42, 43, and 44 of the fourth horizontal line HL4 can charge the R+, R+, R−, and R− data signals supplied through the first, third, fourth, and sixth data lines DL1, DL3, DL4, and DL6, respectively, and the first and third G subpixels 51 and 53 of the fifth horizontal line HL5 can charge the G− and G+ data signals supplied through the second and fifth data lines DL2 and DL5, respectively.

During a fourth horizontal period in which the gate-on voltage VON is supplied to the fourth gate line GL4, the B subpixels 61, 62, 63, and 64 of the sixth horizontal line HL6 can charge the B+, B+, B−, and B− data signals supplied through the first, third, fourth, and sixth data lines DL1, DL3, DL4, and DL6, respectively, and the second and fourth G subpixels 52 and 54 of the fifth horizontal lines HL5 can charge the G− and G+ data signals supplied through the second and fifth data lines DL2 and DL5, respectively. For example, the green subpixels can be controlled with a different polarity than the red and blue subpixels for each adjacent pair of subpixel columns, and the polarity scheme can be different or alternate for every group of two adjacent columns, but embodiments are not limited thereto.

Referring to FIGS. 6 and 8, in an even frame (the second frame), a liquid crystal panel can charge a data signal having a polarity opposite to that of an odd frame. During the even frame, the odd data lines DL1, DL3, and DL5 can supply negative data signals Data1, Data3, and Data5, and the even data lines DL2, DL4, and DL6 can supply positive data signals Data2, Data4, and Data6. For example, in the odd frame, the six data lines can be controlled with alternating positive and negative data signals, and then in the even frame the polarities can be switched and the six data lines can be controlled with alternating negative and positive data signals.

During the first horizontal period in which the first gate line GL1 is driven in an even frame, the R subpixels 11, 12, 13, and 14 of the first horizontal line HL1 can charge the R−, R−, R+, and R+ data signals supplied through the first, third, fourth, and sixth data lines DL1, DL3, DL4, and DL6, respectively, and the first and third G subpixels 21 and 23 of the second horizontal line HL2 can charge the G+ and G− data signals supplied through the second and fifth data lines DL2 and DL5, respectively.

During the second horizontal period in which the second gate line GL2 is driven in an even frame, the B subpixels 31, 32, 33, and 34 of the third horizontal line HL3 can charge the B−, B−, B+, and B+ data signals supplied through the first, third, fourth, and sixth data lines DL1, DL3, DL4, and DL6, respectively, and the second and fourth G subpixels 22 and 24 of the second horizontal line HL2 can charge the G+ and G− data signals supplied through the second and fifth data lines DL2 and DL5, respectively.

During the third horizontal period in which the third gate line GL3 is driven in an even frame, the R subpixels 41, 42, 43, and 44 of the fourth horizontal line HL4 can charge the R−, R−, R+, and R+ data signals supplied through the first, third, fourth, and sixth data lines DL1, DL3, DL4, and DL6, respectively, and the first and third G subpixels 51 and 53 of the fifth horizontal line HL5 can charge the G+ and G− data signals supplied through the second and fifth data lines DL2 and DL5, respectively.

During the fourth horizontal period in which the fourth gate line GL4 is driven in an even frame, the B subpixels 61, 62, 63, and 64 of the sixth horizontal line HL6 can charge the B−, B−, B+, and B+ data signals supplied through the first, third, fourth, and sixth data lines DL1, DL3, DL4, and DL6, respectively, and the second and fourth G subpixels 52 and 54 of the fifth horizontal lines HL5 can charge the G+ and G− data signals supplied through the second and fifth data lines DL2 and DL5, respectively.

The liquid crystal panel illustrated in FIGS. 4 to 6 may be driven in a one dot-two dot mixed inversion method in which one-dot inversion driving in the horizontal direction X, one-dot inversion driving in the vertical direction Y and two-dot inversion driving are mixed.

Figure 9:
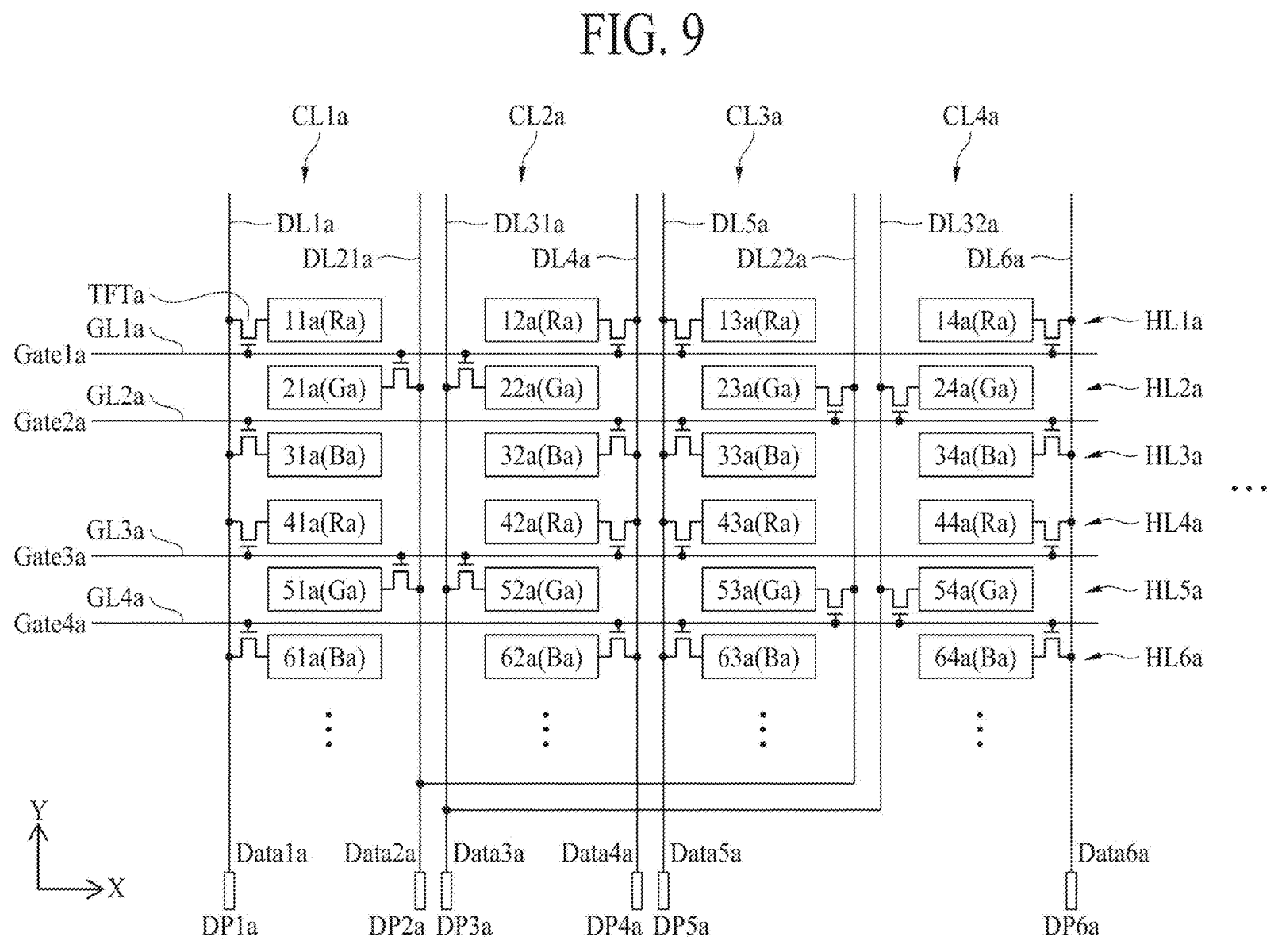

FIG. 9 is a diagram illustrating an example of a pixel arrangement structure of a liquid crystal panel according to another embodiment of the present disclosure.

The liquid crystal panel illustrated in FIG. 9 has a difference in structure in which two data lines are arranged between adjacent column lines compared to the liquid crystal panel illustrated in FIG. 4. For example, the liquid crystal panel illustrated in FIG. 9 has four gate lines GL1, GL2, GL3 and GL4, and eight data lines DL1, DL2*a*, DL3*a*, DL4, DL5, DL2*b*, DL3*b* and DL6 in which the eight data lines are supplied with data from six sources, e.g., the six data pads DP1, DP2, DP3, DP4, DP5 and DP6. In other words, data lines DL2*a* and DL2*b* are branched from the same data pad DP2, and data lines DL3*a* and DL3*b* are branched from the same data pad DP3.

Referring to FIG. 9, in the liquid crystal panel according to an embodiment, the first to sixth horizontal lines HL1*a* to HL6*a* and the first to fourth column lines CL1*a* to CL4*a* can be driven by using the first to fourth gate lines GL1*a* to GL4*a* and the first to sixth data lines DL1*a* to DL6*a*. For example, the liquid crystal panel illustrated in FIG. 9 is similar to the configuration in FIG. 4, except rather than having one data line be disposed between the green subpixels in two adjacent columns, two data lines can be disposed between the green subpixels in two adjacent columns.

The first to third horizontal lines HL1*a*, HL2*a*, and HL3*a* can be driven at a double rate driving manner by the first and second gate lines GL1*a* and GL2*a*, and the fourth to sixth horizontal lines HL4*a*, HL5*a*, and HL6*a* can be driven at a double rate driving manner by the third and fourth gate lines GL3*a* and GL4*a*. Accordingly, the display device according to an embodiment can reduce the number of gate lines to be less than the number of horizontal lines of subpixels.

The gate lines GL1*a* to GL4*a* can be sequentially driven by individually receiving the gate signals Gate1*a* to Gate4*a* from the gate driving circuit 200 (FIG. 1).

The TFTa of the Ra subpixels 11*a*, 12*a*, 13*a*, and 14*a* of the first horizontal line HL1*a* can be connected to the first gate line GL1*a* disposed between the first and second horizontal lines HL1*a* and HL2*a*. The TFTa of the Ba subpixels 31*a*, 32*a*, 33*a*, and 34*a* of the third horizontal line HL3*a* can be connected to the second gate line GL2*a* disposed between the second and third horizontal lines HL2*a* and HL3*a*. The TFTa of the first and second Ga subpixels 21*a* and 22*a* of the first horizontal line HL1*a* can be connected to the first gate line GL1*a*, and the TFTa of the third and fourth Ga subpixels 23*a* and 24*a* of the first horizontal line HL1*a* can be connected to the second gate line GL2*a*.

In the same manner, the fourth to sixth horizontal lines HL4*a*, HL5*a*, and HL6*a* can be connected to the third and fourth gate lines GL3*a* and GL4*a*.

The data lines DL1*a* to DL6*a* can individually receive the data signals Data1*a* to Data6*a* through the data pads DP1*a* to DP6*a* connected to the data driving circuit 300 (FIG. 1).

A (2-1)th data line DL21*a* and a (3-1)th data line DL31*a* can be disposed in parallel between the first column line CL1*a* and the second column line CL2*a*. Fourth and fifth data lines DL4*a* and DL5*a* can be disposed in parallel between the second column line CL2*a* and the third column line CL3*a*. A (2-2)th data line DL22*a* and a (3-2)th data line DL32*a* can be disposed in parallel between the third column line CL3*a* and the fourth column line CL4*a*. The (2-2)th data line DL22*a* can be connected to the (2-1)th data line DL21*a* in a link area and can be connected to the second data pad DP2*a*. The (3-2)th data line DL32*a* can be connected to the (3-1)th data line DL31*a* in a link area and can be connected to the third data pad DP3*a*. For example, data lines DL2*a* and DL2*b* are branched from the same data pad DP2, and data lines DL3*a* and DL3*b* are branched from the same data pad DP3.

The first column line CL1*a* can receive the data signals Data1*a* and Data2*a* through the first and (2-1)th data lines DL1*a* and DL21*a* disposed on the left and right sides of the first column line CL1*a*. The Ra and Ba subpixels 11*a*, 31*a*, 41*a*, and 61*a* of the first column line CL1*a* can be connected to the first data line DL1*a* on the left side through a TFTa to receive the data signal Data1a. The Ga subpixels 21a and 51a of the first column line CL1a can be connected to the (2-1)th data line DL21a on the right side through a TFTa to receive the data signal Data2a.

The second column line CL2a can receive the data signals Data3a and Data4a through the (3-1)th and fourth data lines DL31a and DL4a disposed on the left and right sides of the second column line CL2a. The Ga subpixels 22a and 52a of the second column line CL2a can be connected to the (3-1)th data line DL31a on the left side through a TFTa to receive the data signal Data3a. The Ra and Ba subpixels 12a, 32a, 42a, and 62a of the second column line CL2a can be connected to the fourth data line DL4a on the right side through a TFTa to receive the data signal Data4a.

The third column line CL3a can receive the data signals Data5a and Data2a through the fifth and (2-2)th data lines DL5a and DL2a disposed on the left and right sides of the third column line CL3a. The Ra and Ba subpixels 13a, 33a, 43a, and 63a of the third column line CL3a can be connected to the fifth data line DL5a on the left side through a TFTa to receive the data signal Data5a. The Ga subpixels 23a and 53a of the third column line CL3a can be connected to the (2-2)th data line DL22a on the right side through a TFTa to receive the data signal Data2a.

The fourth column line CL4a can receive the data signals Data3a and Data6a through the (3-2)th and sixth data lines DL32a and DL6a disposed at the left and right sides of the fourth column line CL4a. The Ga subpixels 24a and 54a of the fourth column line CL4a can be connected to the (3-2)th data line DL32a on the left side through a TFTa to receive the data signal Data3a. The Ra and Ba subpixels 14a, 34a, 44a, and 64a of the fourth column line CL4a can be connected to the sixth data line DL6a on the right side through a TFTa to receive the data signal Data6a.

The data lines DL1a to DL6a can include first type data lines DL1a, DL4a, DL5a, and DL6a and the second type data lines DL21a, DL22a, DL31a, and DL32a.

The first type first, fourth, fifth and sixth data lines DL1a, DL4a, DL5a, and DL6a can be connected to Ra and Ba subpixels (first and second color subpixels) of each of the column lines CLn (where n=1, 2, 3, and 4) to supply Ra and Ba data signals Data1a, Data4a, Data5a, and Data6a. Each of the first type first and fifth data lines DL1a and DL5a is disposed on the left side of each of the odd column lines CL1 and CL3, and may be connected to Ra and Ba subpixels (first and third color subpixels) through the TFTa. Each of the first type fourth and sixth data lines DL4a and DL6a is disposed on the right side of each of the even column lines CL2 and CL4, and may be connected to the Ra and Ba subpixels (first and second color subpixels) through the TFTa.

Each of the second type data lines DL21a, DL22a, DL31a, and DL32a is connected to Ga subpixels (second color subpixel) of each of the column lines CLn (where n=1, 2, 3, and 4) to supply Ga data signals Data2a and Data3a. The second type data lines DL21a, DL22a, DL31a, and DL32a can improve image quality by preventing luminance deviation due to difference in charge amount of the same color by supplying data signals of the same color. Each of the second type (2-1)th and (2-2)th data lines DL21a and DL22a is disposed on the right side of each of the odd column lines CL1 and CL3, and may be connected to the Ga subpixels (second color subpixels) through the TFTa. Each of the second type (3-1)th and (3-2)th data lines DL31a and DL32a is disposed on the left side of each of the even column lines CL2 and CL4, and may be connected to the Ga subpixels (first and second color subpixels) through the TFTa. The TFTa connecting the second type (2-1)th and (3-1)th data lines DL21a and DL31a with the Ga subpixels (second color subpixels) of the first and second column lines CL1a and CL2a may be driven by the odd gate lines GL1a and GL3a. The TFTa connecting the second type (2-2)th and (3-2)th data lines DL22a and DL32a with the Ga subpixels (second color subpixels) of the third and fourth column lines CL3a and CL4a may be driven by the even gate lines GL2a and GL3a.

By driving the column inversion method of the data driving circuit 300 (FIG. 1), the polarities of the data signals Data1a, Data3a, and Data5a of the odd data lines DL1a, DL31a, DL32a, and DL5a and the polarities of the data signals Data2a, Data4a, and Data6a of the even data lines DL21a, DL22a, DL4a, and DL6a can be opposite to each other, and can be reversed for each frame.

Figure 10:
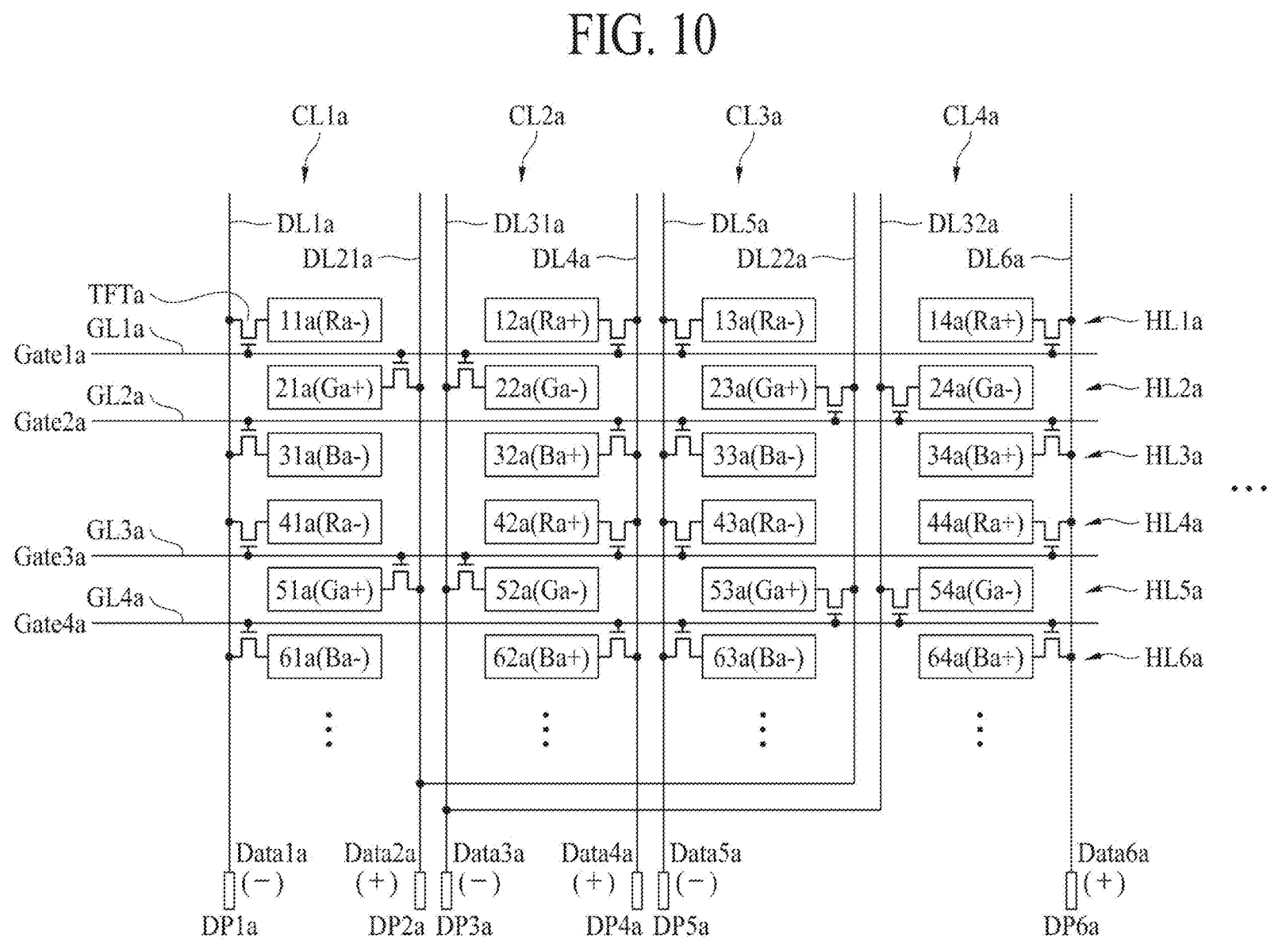
Figure 11:
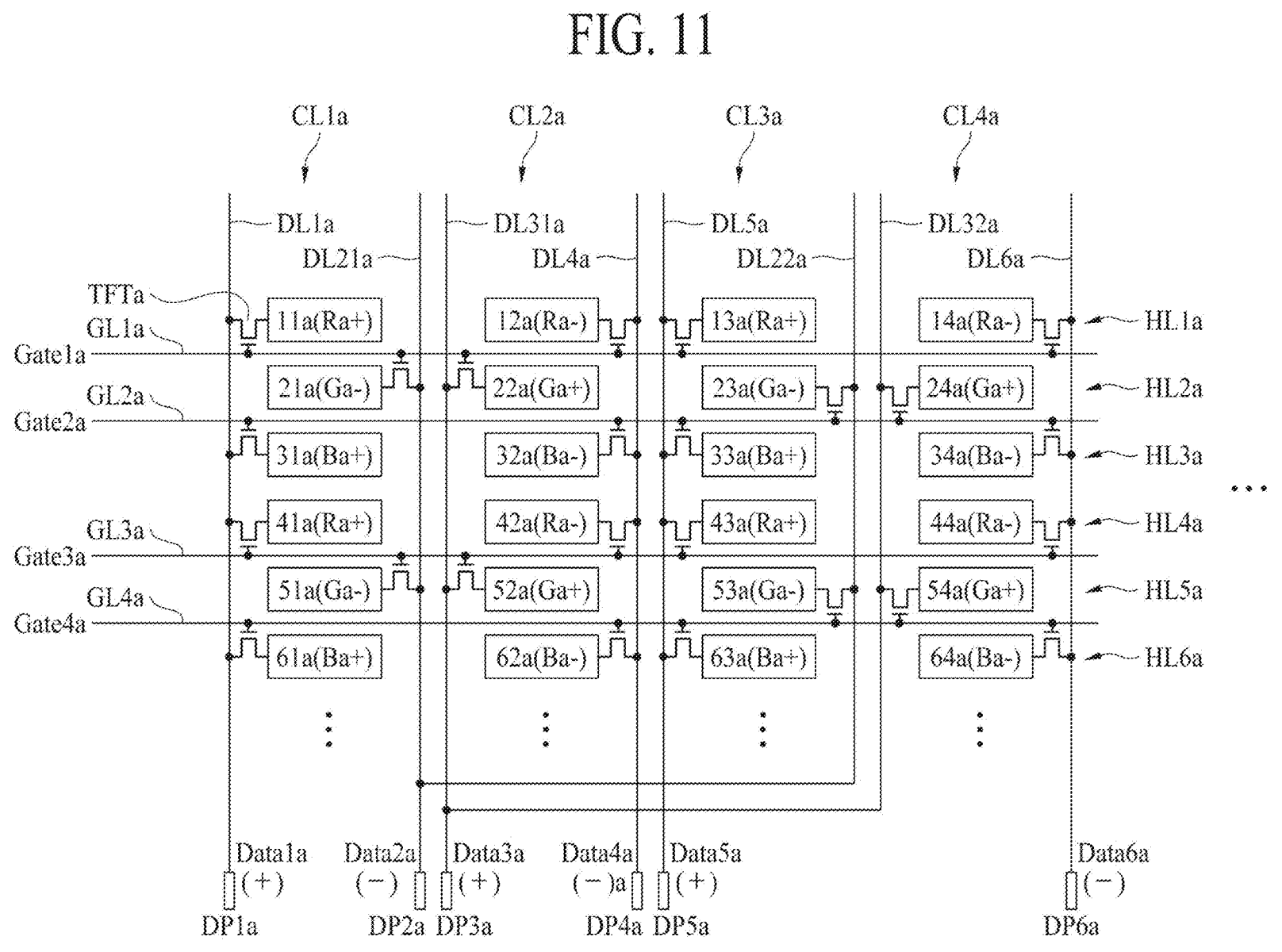
Figure 12:
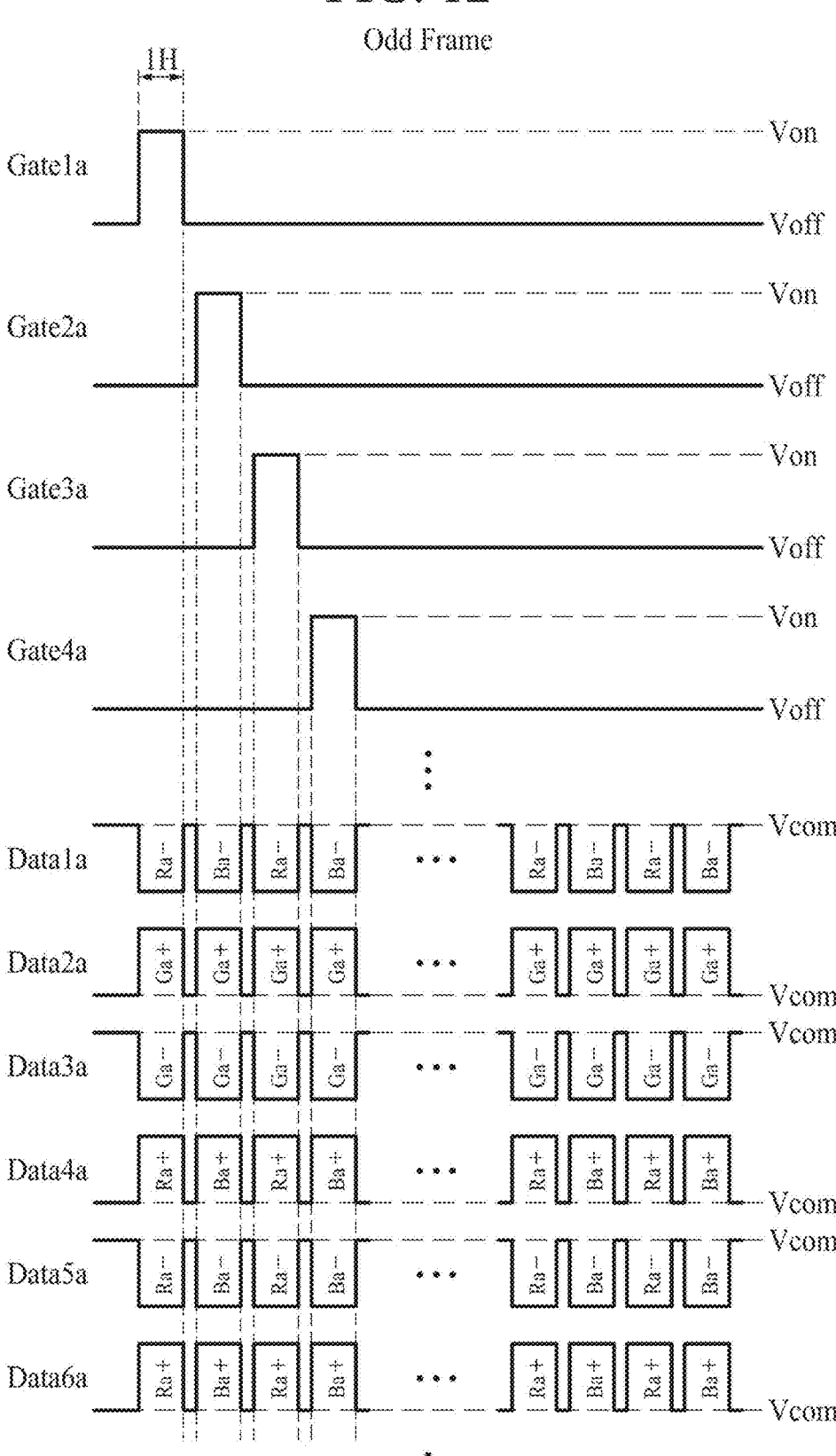
FIG. 12 is an example of a driving waveform diagram of an odd frame with respect to the liquid crystal panel illustrated in FIG. 10 according to an embodiment of the present disclosure.
Figure 13:
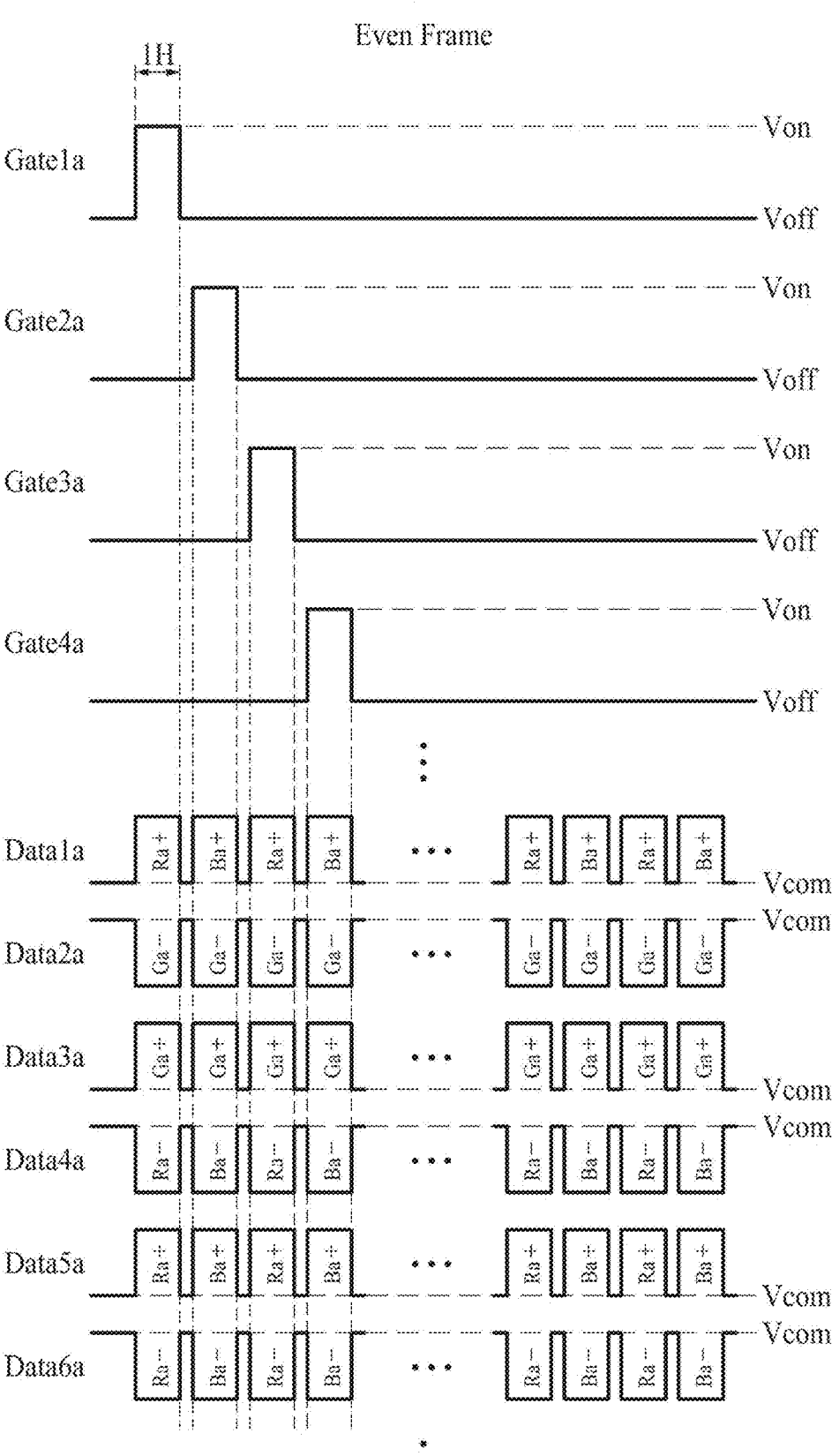
FIG. 13 is an example of a driving waveform diagram of an even frame with respect to the liquid crystal panel shown in FIG. 11 according to an embodiment of the present disclosure.

FIG. 10 is a diagram illustrating an example of an inversion driving method of an odd frame for a liquid crystal panel illustrated in FIG. 9, FIG. 11 is a diagram illustrating an example of an inversion driving method of an even frame for a liquid crystal panel illustrated in FIG. 9, FIG. 12 is an example of a driving waveform diagram of the odd frame for a liquid crystal panel illustrated in FIG. 10, and FIG. 13 is an example of a driving waveform diagram of the even frame for a liquid crystal panel illustrated in FIG. 11.

Referring to FIGS. 10 and 12, in the odd frame (the first frame), the first to fourth gate lines GL1a to GL4a can be sequentially driven for each horizontal period 1H by the gate-on voltage VON of the first to fourth gate signals Gate1a to Gate4a outputted from the gate driving circuit 200 (FIG. 1). The first to sixth data lines DL1a to DL6a can supply first to sixth data signals Data1a to Data6a outputted from the data driving circuit 300 (FIG. 1). During the odd frame, the odd data lines, that is, the (3-1)th, (3-2)th and fifth data lines DL1a, DL31a, DL32a, and DL5a can supply the negative (−) data signals Data1a, Data3a, and Data5a, and the even data lines, that is, the (2-1)th, (2-2)th, fourth and sixth data lines DL21a, DL22a, DL4a, and DL6a can supply the positive (+) data signals Data2a, Data4a, and Data6a.

During a first horizontal period in which the first gate line GL1a is driven by the gate-on voltage VON in the odd frame, the Ra subpixels 11a, 12a, 13a, and 14a of the first horizontal line HL1a can charge the Ra−, Ra+, Ra−, and Ra+ data signals Data1a, Data4a, Data5a, and Data6a supplied through the first type first, fourth, fifth, and sixth data lines DL1a, DL4a, DL5a, and DL6a, respectively, and the first and second Ga subpixels 21a and 22a of the second horizontal line HL2a can charge the Ga+ and Ga− data signals Data2a and Data3a supplied through the second type (2-1)th and (3-1)th data lines DL21a and DL31a, respectively.

During the second horizontal period in which the second gate line GL2a is driven by the gate-on voltage VON in the odd frame, the Ba subpixels 31a, 32a, 33a, and 34a of the third horizontal line HL3a can charge the Ba−, Ba+, Ba−, and Ba+ data signals Data1a, Data4a, Data5a, and Data6a supplied through the first type first, fourth, fifth, and sixth data lines DL1a, DL4a, DL5a, and DL6a, respectively, and the third and fourth Ga subpixels 23a and 24a of the second horizontal line HL2a can charge the Ga+ and Ga− data signals Data2a and Data3a supplied through the second type (2-2)th and (3-2)th data lines DL22a and DL32a, respectively.

During the third horizontal period in which the third gate line GL3a is driven by the gate-on voltage VON in the odd frame, the Ra subpixels 41a, 42a, 43a, and 44a of the fourth horizontal line HL4a can charge the Ra−, Ra+, Ra−, and Ra+ data signals Data1a, Data4a, Data5a, and Data6a supplied through the first type first, fourth, fifth, and sixth data lines DL1*a*, DL4*a*, DL5*a*, and DL6*a*, respectively, and the first and second Ga subpixels 51*a* and 52*a* of the fifth horizontal line HL5*a* can charge the Ga+ and Ga− data signals Data2*a* and Data3*a* supplied through the second type (2-1)th and (3-1)th data lines DL21*a* and DL31*a*, respectively.

During a fourth horizontal period in which the fourth gate line GL4*a* is driven by the gate-on voltage VON in the odd frame, the Ba subpixels 61*a*, 62*a*, 63*a*, and 64*a* of the sixth horizontal line HL6*a* can charge the Ba−, Ba+, Ba−, and Ba+ data signals Data1*a*, Data4*a*, Data5*a*, and Data6*a* supplied through the first type first, fourth, fifth, and sixth data lines DL1*a*, DL4*a*, DL5*a*, and DL6*a*, respectively, and the third and fourth Ga subpixels 53*a* and 54*a* of the fifth horizontal lines HL5*a* can charge the Ga+ and Ga− data signals Data2*a* and Data3*a* supplied through the second type (2-2)th and (3-2)th data lines DL22*a* and DL32*a*, respectively.

Referring to FIGS. 11 and 13, in the even frame (the second frame), a liquid crystal panel can charge a data signal having a polarity opposite to that of the odd frame. During the even frame, the odd data lines, that is, the (3-1)th, (3-2)th and fifth data lines DL1*a*, DL31*a*, DL32*a*, and DL5*a* can supply positive (+) data signals Data1*a*, Data3*a*, and Data5*a*, and the even data lines that is, the (2-1)th, (2-2)th, fourth and sixth data lines DL21*a*, DL22*a*, DL4*a*, and DL6*a* can supply negative (−) data signals Data2*a*, Data4*a*, and Data6*a*.

In the even frame, during a first horizontal period in which the first gate line GL1*a* is driven by the gate-on voltage VON, the Ra subpixels 11*a*, 12*a*, 13*a*, and 14*a* of the first horizontal line HL1*a* can charge the Ra+, Ra−, Ra+, and Ra− data signals Data1*a*, Data4*a*, Data5*a*, and Data6*a* supplied through the first type first, fourth, fifth, and sixth data lines DL1*a*, DL4*a*, DL5, and DL6*a*, respectively, and the first and second Ga subpixels 21*a* and 22*a* of the second horizontal line HL2 can charge the Ga− and Ga+ data signals Data2*a* and Data3*a* supplied through the second type (2-1)th and (3-1)th data lines DL21*a* and DL31*a*, respectively.

In the even frame, during a second horizontal period in which the second gate line GL2*a* is driven by the gate-on voltage VON, the Ba subpixels 31*a*, 32*a*, 33*a*, and 34*a* of the third horizontal line HL3*a* can charge the Ba+, Ba−, Ba+, and Ba− data signals Data1*a*, Data4*a*, Data5*a*, and Data6*a* supplied through the first type first, fourth, fifth, and sixth data lines DL1*a*, DL4*a*, DL5*a*, and DL6*a*, respectively, and the third and fourth Ga subpixels 23*a* and 24*a* of the second horizontal line HL2*a* can charge the Ga− and Ga+ data signals Data2*a* and Data3*a* supplied through the second type (2-2)th and (3-2)th data lines DL22*a* and DL32*a*, respectively.

In the even frame, during a third horizontal period in which the third gate line GL3*a* is driven by the gate-on voltage VON, the Ra subpixels 41*a*, 42*a*, 43*a*, and 44*a* of the fourth horizontal line HL4*a* can charge the Ra−, Ra+, Ra−, and Ra+ data signals Data1*a*, Data4*a*, Data5*a*, and Data6*a* supplied through the first type first, fourth, fifth, and sixth data lines DL1*a*, DL4*a*, DL5*a*, and DL6*a*, respectively, and the first and second Ga subpixels 51*a* and 52*a* of the fifth horizontal line HL5*a* can charge the Ga+ and Ga− data signals Data2*a* and Data3*a* supplied through the second type (2-1)th and (3-1)th data lines DL21*a* and DL31*a*, respectively.

In the even frame, during a fourth horizontal period in which the fourth gate line GL4*a* is driven by the gate-on voltage VON, the Ba subpixels 61*a*, 62*a*, 63*a*, and 64*a* of the sixth horizontal line HL6*a* can charge the Ba−, Ba+, Ba−, and Ba+ data signals Data1*a*, Data4*a*, Data5*a*, and Data6*a* supplied through the first type first, fourth, fifth, and sixth data lines DL1*a*, DL4*a*, DL5*a*, and DL6*a*, respectively, and the third and fourth Ga subpixels 53*a* and 54*a* of the fifth horizontal lines HL5*a* can charge the Ga+ and Ga− data signals Data2*a* and Data3*a* supplied through the second type (2-2)th and (3-2)th data lines DL22*a* and DL32*a*, respectively.

The liquid crystal panel illustrated in FIGS. 9 to 11 may be driven in a one dot-two dot mixed inversion method in which one-dot inversion driving in the horizontal direction X, one-dot inversion driving in the vertical direction Y and two-dot inversion driving are mixed.

Figure 14:
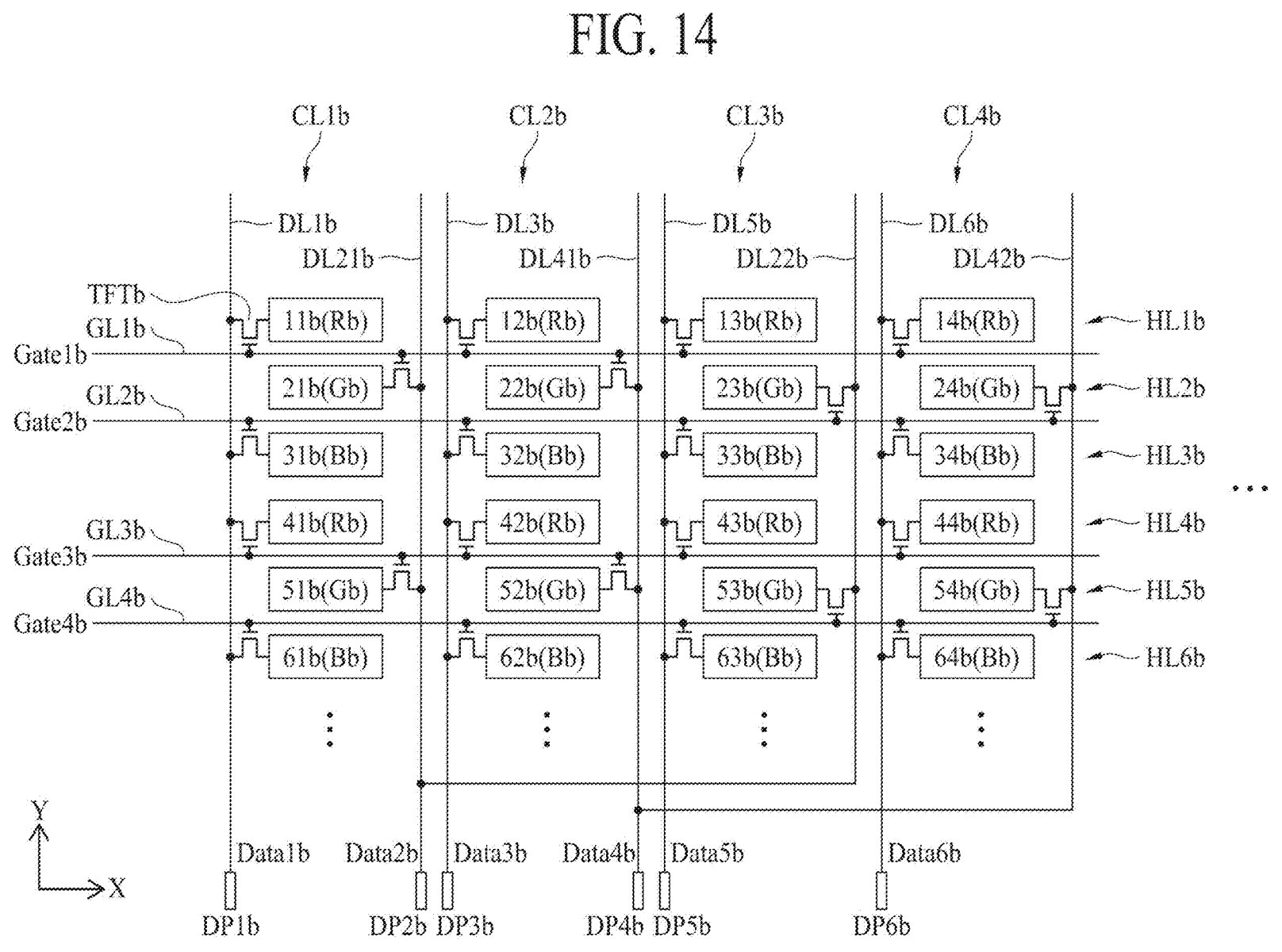

FIG. 14 is a diagram illustrating an example of a pixel arrangement structure of a liquid crystal panel according to an embodiment of the present disclosure.

Compared to the liquid crystal panel illustrated in FIG. 9, the liquid crystal panel illustrated in FIG. 14 has a structure in which a first type data line and a second type data line are evenly disposed between adjacent column lines.

Referring to FIG. 14, in the liquid crystal panel according to an embodiment, first to sixth horizontal lines HL1*b* to HL6*b* and first to fourth column lines CL1*b* to CL4*b* may be driven by using first to fourth gate lines GL1*b* to GL4*b* and first to sixth data lines DL1*b* to DL6*b*.

The first to third horizontal lines HL1*b*, HL2*b*, and HL3*b* may be driven at a double rate by first and second gate lines GL1*b* and GL2*b*, and the fourth to sixth horizontal lines HL4*b*, HL5*b*, and HL6*b* may be driven at a double rate by third and fourth gate lines GL3*b* and GL4*b*. Accordingly, the display device according to an embodiment may reduce the number of gate lines compared to the number of horizontal lines.

The gate lines GL1*b* to GL4*b* may be sequentially driven by receiving the gate signals Gbte1*b* to Gbte4*b* individually from the gate driving circuit 200 (FIG. 1).

TFTb of Rb subpixels 11*b*, 12*b*, 13*b*, and 14*b* of the first horizontal line HL1*b* may be connected to the first gate line GL1*b* disposed between the first and second horizontal lines HL1*b* and HL2*b*. TFTb of Bb subpixels 31*b*, 32*b*, 33*b*, and 34*b* of the third horizontal line HL3*b* may be connected to the second gate line GL2*b* disposed between the second and third horizontal lines HL2*b* and HL3*b*. TFTb of first and second Gb subpixels 21*b* and 22*b* of the first horizontal line HL1 may be connected to the first gate line GL1*b*, and TFTb of the third and fourth Gb subpixels 23*b* and 24*b* of the first horizontal line HL1*b* may be connected to the second gate line GL2*b*.

In the same manner, the fourth to sixth horizontal lines HL4*b*, HL5*b*, and HL6*b* may be connected to the third and fourth gate lines GL3*b* and GL4*b*.

The data lines DL1*b* to DL6*b* may individually receive data signals Dbtb1*b* to Dbtb6*b* through data pads DP1*b* to DP6*b* connected to the data driving circuit 300 (FIG. 1).

A (2-1)th data line DL21*b* and the third data line DL3*b* may be disposed in parallel between the first column line CL1*b* and the second column line CL2*b*. A (4-1)th and fifth data lines DL41*b* and DL5*b* may be disposed in parallel between the second column line CL2*b* and the third column line CL3*b*. A (2-2) data line DL22*b* and the sixth data line DL6*b* may be disposed in parallel between the third column line CL3*b* and the fourth column line CL4*b*. The (2-2) data line DL22*b* may be connected to the (2-1)th data line DL21*b* in a link area, and may be connected to the second data pad DP2*b*. A (4-2)th data line DL42*b* may be connected to the (4-1)th data line DL41*b* in a link area, and may be connected to the fourth data pad DP4*b*.

The first column line CL1*b* may receive data signals Data1*b* and Data2*b* through the first and (2-1) data lines DL1 and DL21*b* disposed on the left and right sides of the first column line CL1*b*. Rb and Bb subpixels 11*b*, 31*b*, 41*b*, and 61*b* of the first column line CL1*b* may be connected to the first data line DL1*b* on the left side through the TFTb to receive the data signal Data1*b*. Gb subpixels 21*b* and 51*b* of the first column line CL1*b* may be connected to the (2-1)th data line DL21*b* on the right side through the TFTb to receive the data signal Data2*b*.

The second column line CL2*b* may receive data signals Data3*b* and Data4*b* through the third and (4-1)th data lines DL3*b* and DL41*b* disposed on the left and right sides of the second column line CL2*b*. Rb and Bb subpixels 12*b*, 32*b*, 42*b*, and 62*b* of the second column line CL2*b* may be connected to the third data line DL3*b* on the left side through TFTb to receive the data signal Data3*b*. Gb subpixels 22*b* and 52*b* of the second column line CL2*b* may be connected to the (4-1)th data line DL41*b* on the right side through the TFTb to receive the data signal Data4*b*.

The third column line CL3*b* may receive data signals Data5*b* and Data2*b* through the fifth and (2-2)th data lines DL5*b* and DL22*b* disposed on the left and right sides of the third column line CL3*b*. Rb and Bb subpixels 13*b*, 33*b*, 43*b*, and 63*b* of the third column line CL3*b* may be connected to the fifth data line DL5*b* on the left side thereof through TFTb to receive the data signal Data5*b*. Gb subpixels 23*b* and 53*b* of the third column line CL3*b* may be connected to the (2-2)th data line DL22*b* on the right side through the TFTb to receive the data signal Data2*b*.

The fourth column line CL4*b* may receive data signals Data6*b* and Data4*b* through the sixth and (4-2)th data lines DL6*b* and DL42*b* disposed on the left and right sides of the fourth column line CL4*b*. Rb, Bb subpixels 14*b*, 34*b*, 44*b*, and 64*b* of the fourth column line CL4*b* may be connected to the sixth data line DL6*b* on the left side through the TFTb to receive the data signal Data6*b*. Gb subpixels 24*b* and 54*b* of the fourth column line CL4*b* may be connected to the (4-2)th data line DL42*b* on the right side through the TFTb to receive the data signal Data4*b*.

The data lines DL1*b* to DL6*b* may include first type data lines DL1*b*, DL3*b*, DL5*b*, and DL6*b* and second type data lines DL21*b*, DL41*b*, DL22*b*, and DL42*b*.

Each of the first type data lines DL1*b*, DL3*b*, DL5*b*, and DL6*b* may be disposed on the left side of each of the column lines CLn, n=1, 2, 3, and 4, and may be connected to the Rb and Bb subpixels (first color and second color subpixels) through the TFTb to supply the Rb and Bb data signals Data1*b*, Data3*b*, Data5*b*, and Data6*b*.

Each of the second type data lines DL21*b*, DL41*b*, DL22*b*, and DL42*b* is disposed on the right side of each of the column lines CLn, n=1, 2, 3, and 4, and is connected to the Gb subpixel (second color subpixel) through the TFTb to supply the Gb data signals Data2*b* and Data4*b*. The second type data lines DL21*b*, DL41*b*, DL22*b*, and DL42*b* may image quality by preventing luminance deviation due to difference in charge amount of the same color by supplying data signals of the same color. The TFTb connecting the second type (2-1)th and (4-1)th data lines DL21*b* and DL41*b* to the Gb subpixels (second color subpixels) of the first and second column lines CL1*b* and CL2*b* may be driven by the odd gate lines GL1*b* and GL3*b*. The TFTb connecting the second type (2-2)th and (4-2)th data lines DL22*b* and DL42*b* to the Gb subpixels (second color subpixels) of the third and fourth column lines CL3*b* and CL3*b* may be driven by the even gate lines GL2*b* and GL3*b*.

By driving the column inversion method of the data driving circuit 300 (see FIG. 1), the polarities of the data signals Data1*b*, Data4*b*, and Data5*b* of the first, fourth, and fifth data lines DL1*b*, DL41*b*, DL42*b*, and DL5*b* and the polarities of the data signals Data2*b*, Data3*b*, and Data6*b* of the second, third, and sixth data lines DL21*b*, DL22*b*, DL3*b*, and DL3*b* can be opposite to each other, and can be reversed for each frame.

Figure 15:
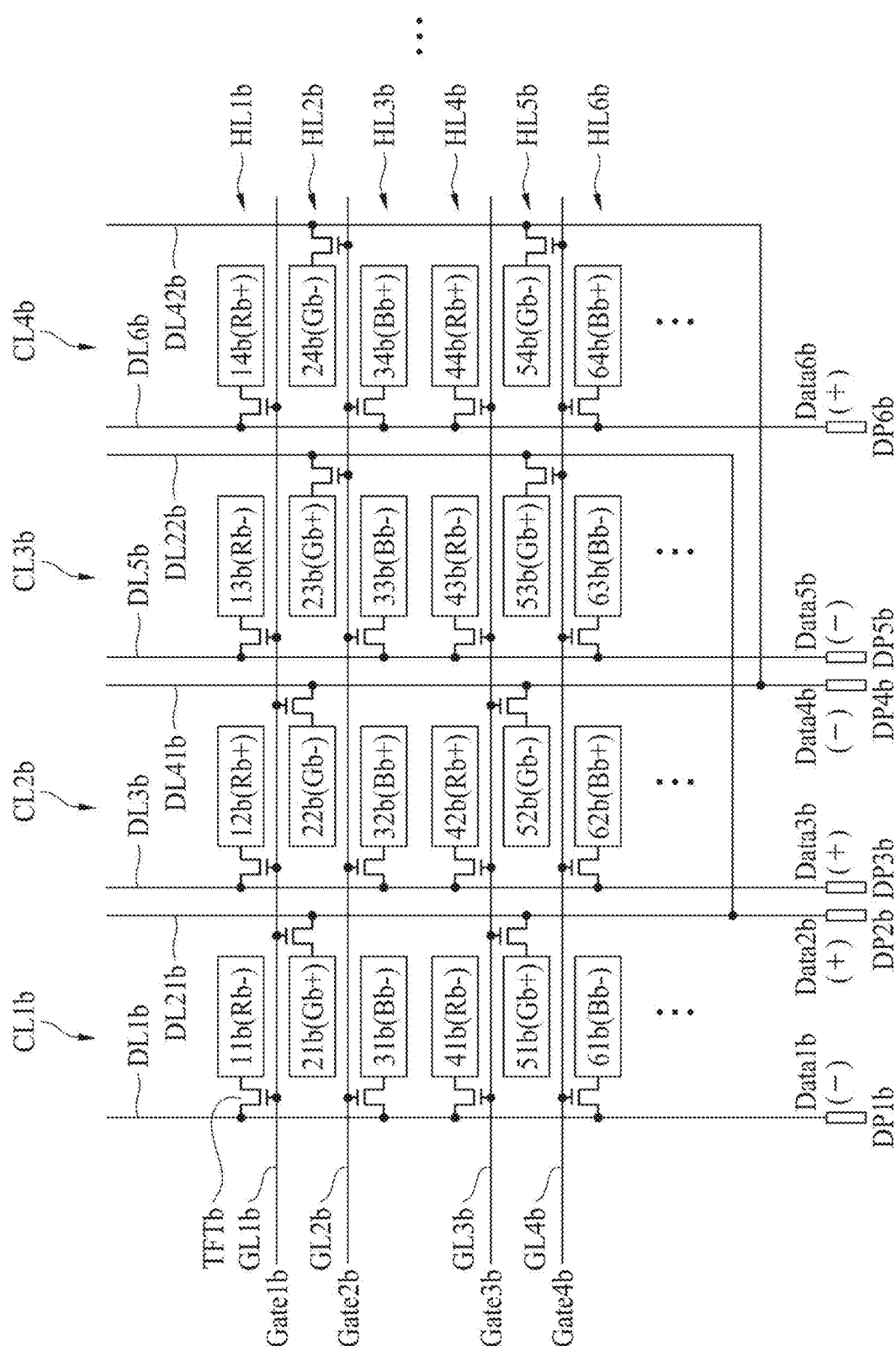
FIG. 15 is a diagram illustrating an example of an inversion driving method of an odd frame with respect to the liquid crystal panel illustrated in FIG. 14.
Figure 16:
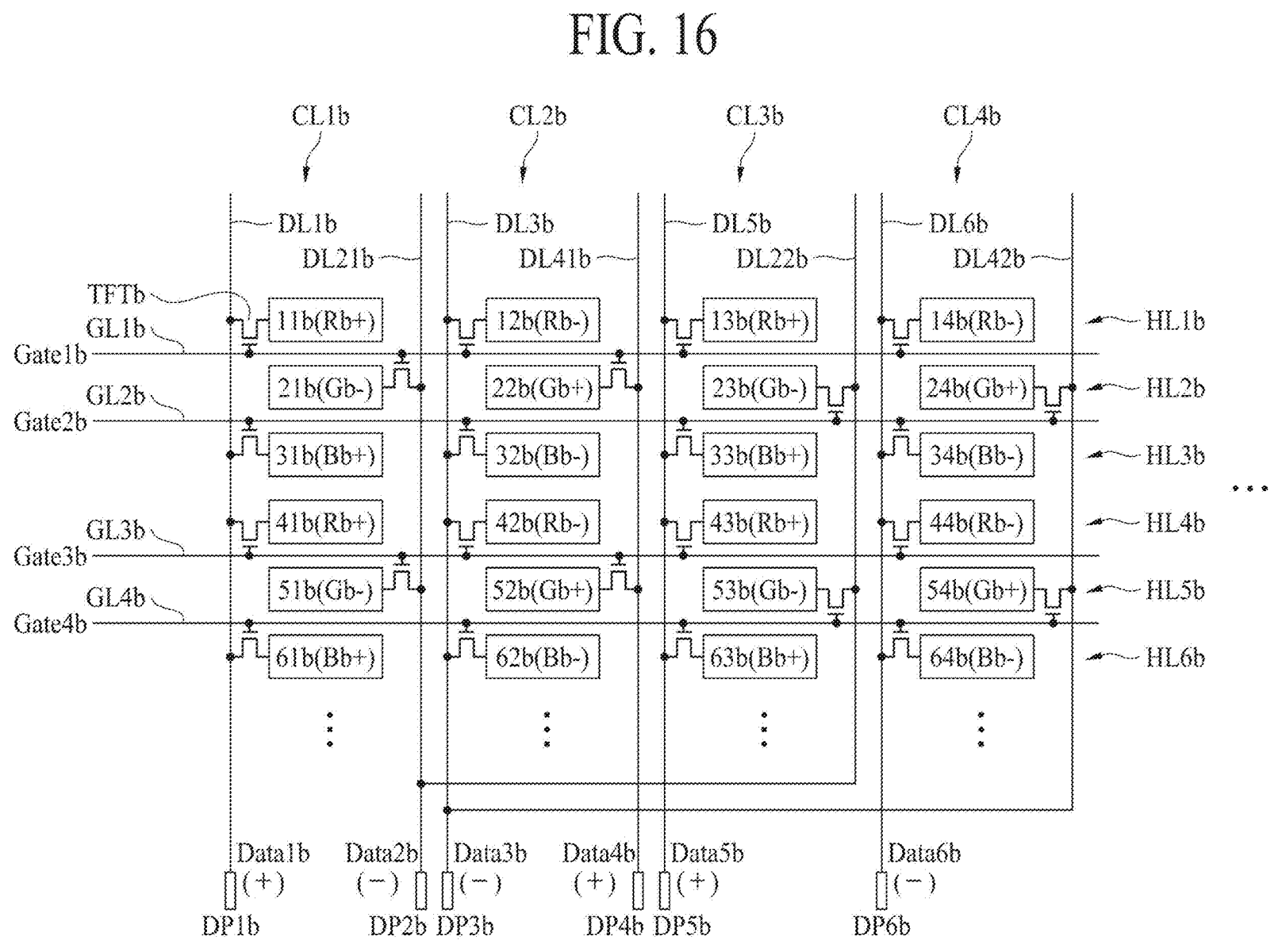
Figure 17:
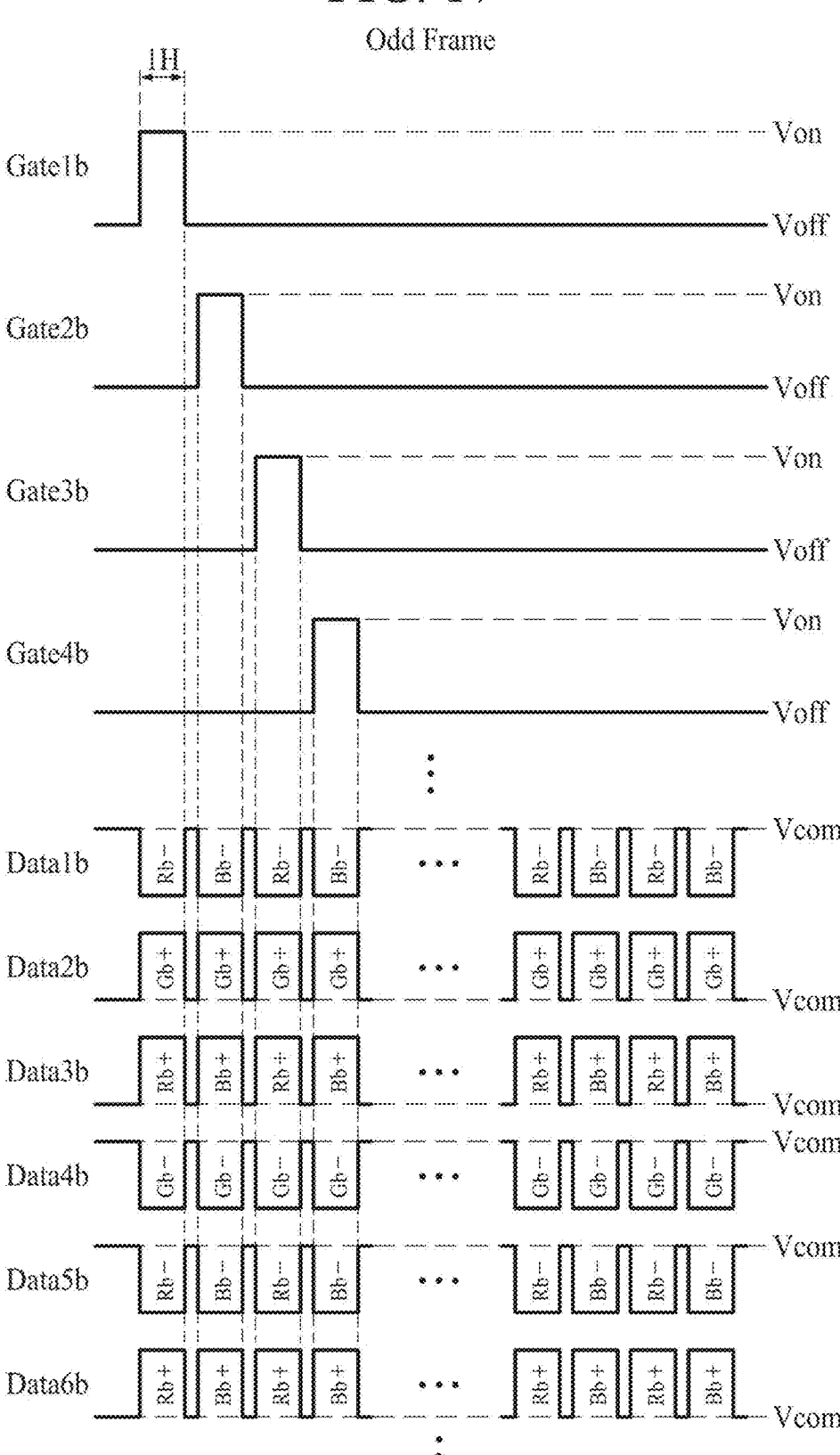
FIG. 17 is an example of a driving waveform diagram of an odd frame with respect to the liquid crystal panel illustrated in FIG. 15.
Figure 18:
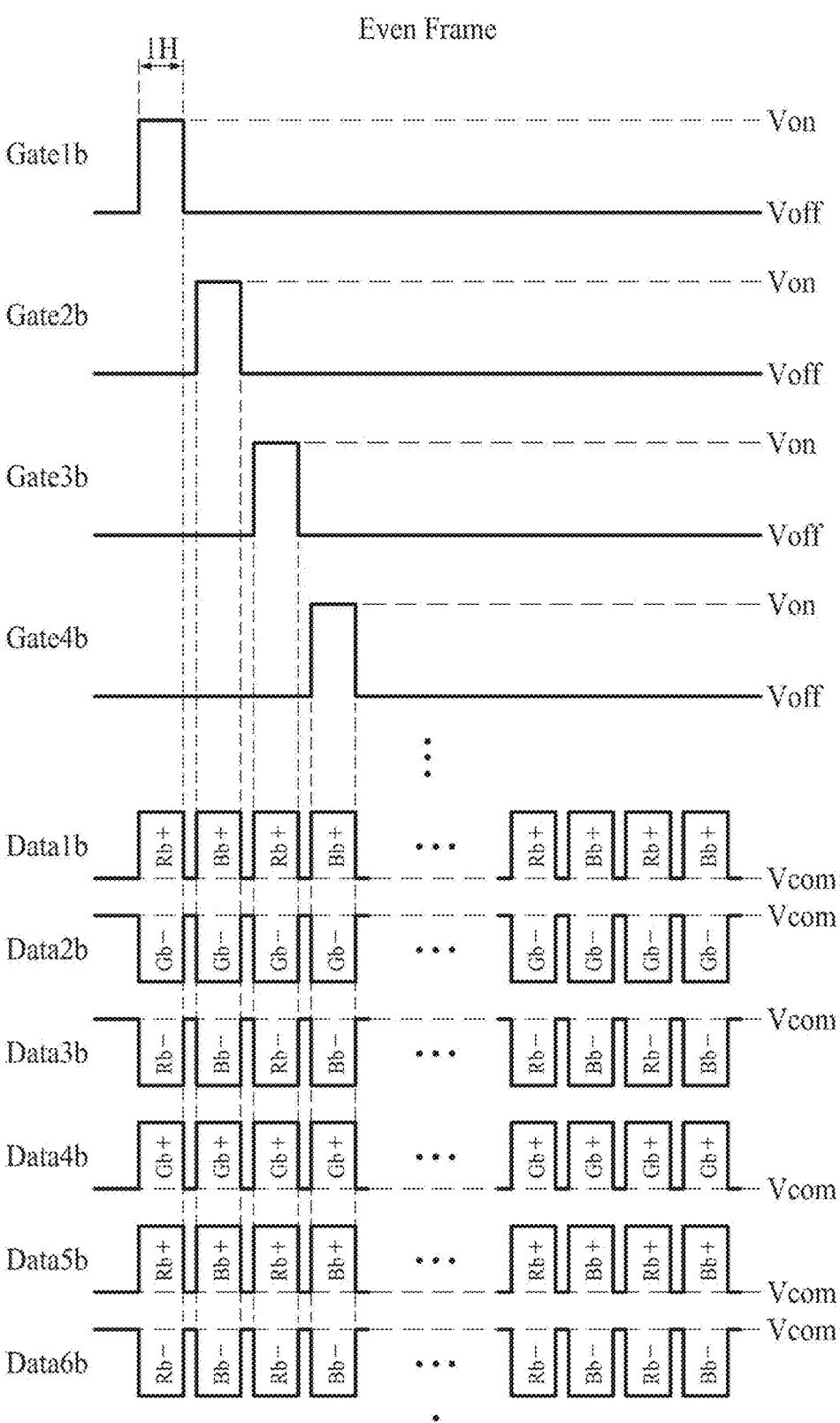
FIG. 18 is an example of a driving waveform diagram of an even frame with respect to the liquid crystal panel illustrated in FIG. 16.

FIG. 15 is a diagram illustrating an example of an inversion driving method of an odd frame with respect to the liquid crystal panel illustrated in FIG. 14, FIG. 16 is a diagram illustrating an example of an inversion driving method of an even frame with respect to the liquid crystal panel illustrated in FIG. 14, FIG. 17 is an example of a driving waveform diagram of an odd frame with respect to the liquid crystal panel illustrated in FIG. 15, and FIG. 18 is an example of a driving waveform diagram of an even frame with respect to the liquid crystal panel illustrated in FIG. 16.

Referring to FIGS. 15 and 17, in the odd frame (the first frame), the first to fourth gate lines GL1*b* to GL4*b* may be sequentially driven by the gate-on voltage VON of first to fourth gate signals Gbte1*b* to Gbte4*b* output from the gate driving circuit 200 (FIG. 1) in units of the horizontal period 1H. The first to sixth data lines DL1*b* to DL6*b* may supply the first to sixth data signals Data1*b* to Data6*b* output from the data driving circuit 300 (FIG. 1). During the odd frame, the first, (4-1)th, (4-2)th, and fifth data lines DL1*b*, DL41*b*, DL42*b*, and DL5*b* may supply the negative (−) data signals Data1*b*, Data3*b*, and Data5*b*, and the (2-1)th, (2-2)th, third, and sixth data lines DL21*b*, DL22*b*, DL3*b*, and DL3*b* may supply the positive (+) data signals Data2*b*, Data4*b*, and Data6*b*.

During the first horizontal period in which the first gate line GL1*b* is driven by the gate-on voltage VON in the odd frame, the Rb subpixels 11*b*, 12*b*, 13*b*, and 14*b* of the first horizontal line HL1*b* may charge the Rb−, Rb+, Rb−, and Rb− data signals Data1*b*, Data4*b*, Data5*b*, and Data6*b* supplied through the first type first third, fifth, and sixth data lines DL1*b*, DL3*b*, DL5*b*, and DL6*b*, respectively, and the first and second Gb subpixels 21*b* and 22*b* of the second horizontal line HL2*b* may charge the Gb+ and Gb− data signals Data2*b* and Data4*b* supplied through the second type (2-1)th and (4-1)th data lines DL21*b* and DL41*b*, respectively.

During the second horizontal period in which the second gate line GL2*b* is driven by the gate-on voltage VON in the odd frame, the Bb subpixels 31*b*, 32*b*, 33*b*, and 34*b* of the third horizontal line HL3*b* may charge the Bb−, Bb+, Bb−, Bb−, and Bb+ data signals Data1*b*, Data3*b*, Data5*b*, and Data6*b* supplied through the first type first, third, fifth and sixth data lines DL1*b*, DL3*b*, DL5*b* and DL6*b*, respectively, and the third and fourth Gb subpixels 23*b* and 24*b* of the second horizontal line HL2*b* may charge the Gb+ and Gb− data signals Data2*b* and Data4*b* supplied through the second type the (2-2)th and (4-2)th data lines DL22*b* and DL42*b*, respectively.

During the third horizontal period in which the third gate line GL3*b* is driven by the gate-on voltage VON in the odd frame, the Rb subpixels 41*b*, 42*b*, 43*b*, and 44*b* of the fourth horizontal line HL4*b* may charge the Rb−, Rb+, Rb−, and Rb+ data signals Data1*b*, Data3*b*, Data5*b*, and Data6*b* supplied through the first, third, fifth, and sixth data lines DL1*b*, DL3*b*, DL5*b*, and DL6*b*, respectively, and the first and second Gb subpixels 51*b* and 52*b* of the fifth horizontal line HL5*b* may charge the Gb+ and Gb− data signals Data2*b* and Data4*b* supplied through the second type (2-1)th and (4-1)th data lines DL21*b* and DL41*b*, respectively.

During the fourth horizontal period in which the fourth gate line GL4*b* is driven by the gate-on voltage VON in the odd frame, the Bb subpixels 61*b*, 62*b*, 63*b*, and 64*b* of the sixth horizontal line HL6*b* may charge the Bb−, Bb+, Bb−, Bb–, and Bb+ data signals Data1b, Data3b, Data5b, and Data6b supplied through the first type first, third, fifth, and sixth data lines DL1b, DL3b, DL5b, and DL6b, respectively, and the third and fourth Gb subpixels 53b and 54b of the fifth horizontal lines HL5b may charge the Gb+ and Gb– data signals Data2b and Data4b supplied through the second type (2-2)th and (4-2)th data lines DL22b and DL42b, respectively.

Referring to FIGS. 16 and 18, in the even frame (the second frame), the liquid crystal panel may charge a data signal having a polarity opposite to that of the odd frame. During the even frame, the first, (4-1)th, (4-2)th, and fifth data lines DL1b, DL41b, DL42b, and DL5b may supply positive (+) data signals Data1b, Data4b, and Data5b, and the (2-1)th, (2-2)th, third, and sixth data lines DL21b, DL22b, DL3b, and DL3b may supply negative (–) data signals Data2b, Data3b, and Data6b.

During the first horizontal period in which the first gate line GL1b is driven by the gate-on voltage VON in the even frame, the Rb subpixels 11b, 12b, 13b, and 14b of the first horizontal line HL1b may charge the Rb+, Rb–, Rb+, and Rb– data signals Data1b, Data3b, Data5b, and Data6b supplied through the first type first third, fifth, and sixth data lines DL1b, DL3b, DL5b, and DL6b, respectively, and the first and second Gb subpixels 21b and 22b of the second horizontal line HL2b may charge the Gb– and Gb+ data signals Data2b and Data4b supplied through the second type (2-1)th and (4-1)th data lines DL21b and DL41b, respectively.

During the second horizontal period in which the second gate line GL2b is driven by the gate-on voltage VON in the even frame, the Bb subpixels 31b, 32b, 33b, and 34b of the third horizontal line HL3b may charge the Bb+, Bb–, Bb+, and Bb– data signals Data1b, Data3b, Data5b, and Data6b supplied through the first type first, third, fifth and sixth data lines DL1b, DL3b, DL5b and DL6b, respectively, and the third and fourth Gb subpixels 23b and 24b of the second horizontal line HL2b may charge the Gb– and Gb+ data signals Data2b and Data4b supplied through the second type the (2-2)th and (4-2)th data lines DL22b and DL42b, respectively.

During the third horizontal period in which the third gate line GL3b is driven by the gate-on voltage VON in the even frame, the Rb subpixels 41b, 42b, 43b, and 44b of the fourth horizontal line HL4b may charge the Rb+, Rb–, Rb+, Rb– data signals Data1b, Data3b, Data5b, and Data6b supplied through the first, third, fifth, and sixth data lines DL1b, DL3b, DL5b, and DL6b, respectively, and the first and second Gb subpixels 51b and 52b of the fifth horizontal line HL5b may charge the Gb– and Gb+ data signals Data2b and Data4b supplied through the second type (2-1)th and (4-1)th data lines DL21b and DL41b, respectively.

During the fourth horizontal period in which the fourth gate line GL4b is driven by the gate-on voltage VON in the even frame, the Bb subpixels 61b, 62b, 63b, and 64b of the sixth horizontal line HL6b may charge the Bb+, Bb–, Bb+, and Bb– data signals Data1b, Data3b, Data5b, and Data6b supplied through the first type first, third, fifth, and sixth data lines DL1b, DL3b, DL5b, and DL6b, respectively, and the third and fourth Gb subpixels 53b and 54b of the fifth horizontal lines HL5b may charge the Gb– and Gb+– data signals Data2b and Data4b supplied through the second type (2-2)th and (4-2)th data lines DL22b and DL42b, respectively.

The liquid crystal panel illustrated in FIGS. 14 to 16 may be driven in a one dot-two dot mixed inversion method in which one-dot inversion driving in the horizontal direction X, one-dot inversion driving in the vertical direction Y and two-dot inversion driving are mixed.

Accordingly, the present disclosure can have the following advantages.

According to an embodiment of present disclosure, each subpixel has a long side in a horizontal direction and a short side in a vertical direction, and the common electrode does not overlap with the data line, thereby reducing the load of the data line to achieve a low power consumption effect, and reducing the ripple effect of the common voltage to prevent image quality defects.

According to an embodiment of present disclosure, by driving in a double-rate driving method using three horizontal lines and two gate lines (e.g., 2 gate lines to control 3 rows of subpixels), manufacturing costs can be reduced by reducing the number of gate lines than the number of horizontal lines, resulting in production energy reduction and greenhouse gas reduction effects.

According to an embodiment of present disclosure, the display device according to an embodiment can include a first type of data line that alternately supplies two-color data signals and a second type of data line that supplies data signals of the same color, and the second type of data line supplies data signals of the same color to prevent luminance deviations of the same color.

According to an embodiment of present disclosure, the display device according to an embodiment can achieve a low power consumption effect by supplying data signals to a plurality of data lines in a column-inversion method, and can improve image quality without generating flicker by mixing the liquid crystal panel in a 1-dot-2 dot-inversion method.

According to an embodiment of the present disclosure, the display device according to some embodiments can improve image quality by improving low grayscale stains or low grayscale image defects by compensating for luminance sensitivity differences by generating current sensitivity differences between R/G/B subpixels, and can further provide improved image quality even with low power consumption by improving low grayscale stains or defects.

The display device according to one or more embodiments of the present disclosure can be applied to various electronic devices. For example, the display device according to one or more embodiments of the present disclosure can be applied to a mobile device, a video phone, a smart watch, a watch phone, a wearable device, a foldable device, a rollable device, a bendable device, a flexible device, a curved device, an electronic diary, electronic book, a portable multimedia player (PMP), a personal digital assistant (PDA), MP3 player, a mobile medical device, a desktop PC, a laptop PC, a netbook computer, a workstation, a navigator, a vehicle navigator, a vehicle display device, a television, a wall paper display device, a signage device, a game device, a notebook computer, a monitor, a camera, a camcorder, and home appliances.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A display device comprising:

a first horizontal line including first color subpixels arranged in a horizontal direction;

a second horizontal line including second color subpixels arranged in the horizontal direction;

a third horizontal line including third color subpixels arranged in the horizontal direction;

a first gate line disposed between the first and second horizontal lines and connected to the first color subpixels in the first horizontal line and connected to some of the second color subpixels in the second horizontal line;

a second gate line disposed between the second and third horizontal lines and connected to the third horizontal line and connected to remaining subpixels among the second color subpixels in the second horizontal line;

first to fourth column lines, each including alternating arrangements of the first to third color subpixels of the first to third horizontal lines in a vertical direction;

a first data line disposed on a left side of the first column line and connected to the first and third color subpixels in the first column line;

a third data line disposed on a right side of the second column line and connected to the first and third color subpixels in the second column line;

a second data line disposed between the first and second column lines and connected to the second color subpixels in the first column line and the second color subpixels in the second column line; and a fourth data line disposed parallel to the third data line and between the second column line and the third column line, the fourth data line being connected to the first and third color subpixels in the third column line.

2. The display device according to claim 1, wherein the first to third horizontal lines are configured to be driven in a double rate driving manner by the first and second gate lines.

3. The display device according to claim 1, further comprising:

a sixth data line disposed on a right side of the fourth column line and connected to the first and third color subpixels in the fourth column line; and a fifth data line disposed between the third and fourth column lines and connected to the second color subpixels in the third column line and the second color subpixels in the fourth column line.

4. The display device according to claim 3, wherein, during a first horizontal period in which a gate-on voltage is applied to the first gate line, first color subpixels in the first horizontal line that are connected to the first and third data lines are configured to be charged by receiving first color data signals of a first polarity, and first color subpixels in the first horizontal line that are connected to the fourth and sixth data lines are configured to be charged by receiving first color data signals of a second polarity, respectively, and a second color subpixel in the second horizontal line that is connected to the second data line is configured to be charged by receiving a second color data signal of the second polarity, and another second color subpixel in the second horizontal line that is connected to the fifth data line is configured to be charged by receiving a second color data signal of the first polarity.

5. The display device according to claim 3, wherein during a second horizontal period in which a gate-on voltage is applied to the second gate line, third color subpixels in the third horizontal line that are connected to the first and third data lines are configured to be charged by receiving third color data signals of a first polarity, and third color subpixels in the third horizontal line that are connected to the fourth and sixth data lines are configured to be charged by receiving third color data signals of a second polarity, respectively, and a second color subpixel in the second horizontal line that is connected to the second data line is configured to be charged by receiving a second color data signal of the second polarity, and another second color subpixel in the second horizontal line that is connected to the fifth data line is configured to be charged by receiving a second color data signal of the first polarity.

6. The display device according to claim 3, wherein each of the first to sixth data lines is configured to receive a data signal having a polarity opposite to a polarity of an adjacent data line, and wherein polarities of data signals applied to the each of the first to sixth data lines are all of a same polarity for one frame, and are inverted for adjacent frames.

7. The display device according to claim 1, wherein each of the first to third color subpixels have a long side in the horizontal direction and a short side in the vertical direction.

8. A display device comprising:

a first horizontal line including first color subpixels arranged in a horizontal direction;

a second horizontal line including second color subpixels arranged in the horizontal direction;

a third horizontal line including third color subpixels arranged in the horizontal direction;

a first gate line disposed between the first and second horizontal lines and connected to the first color subpixels in the first horizontal line and connected to some of the second color subpixels in the second horizontal line;

a second gate line disposed between the second and third horizontal lines and connected to the third color subpixels in the third horizontal line and connected to remaining subpixels among the second color subpixels in the second horizontal line;

first to fourth column lines, each including alternating arrangements of the first to third color subpixels of the first to third horizontal lines in a vertical direction;

a first data line disposed on a left side of the first column line and connected to the first and third color subpixels in the first column line;

a (2-1)th data line disposed between the first and second column lines and connected to the second color subpixels in the first column line, and a (3-1)th data line disposed between the first and second column lines and connected to the second color subpixels in the second column line;

a fourth data line disposed between the second and third column lines and connected to the first and third color subpixels in the second column line, and a fifth data line disposed between the second and third column lines and connected to the first and third color subpixels in the third column line;

a (2-2)th data line disposed between the third and fourth column lines and connected to the second color subpixels in the third column line, and a (3-2)th data line disposed between the third and fourth column lines and connected to the second color subpixels in the fourth column line; and a sixth data line disposed on a right side of the fourth column line and connected to the first and third color subpixels in the fourth column line, wherein the (2-1)th data line is connected to the (2-2)th data line, and wherein the (3-1)th data line is connected to the (3-2)th data line.

9. The display device according to claim 8, wherein the first to third horizontal lines are configured to be driven in a double rate driving manner by the first and second gate lines.

10. The display device according to claim 8, wherein during a first horizontal period in which a gate-on voltage is applied to the first gate line, first color subpixels in the first horizontal line that are connected to the first and fifth data lines are configured to be charged by receiving first color data signals of a first polarity, and first color subpixels in the first horizontal line that are connected to the fourth and sixth data lines are configured to be charged by receiving first color data signals of a second polarity, respectively, and a second color subpixel in the second horizontal line that is connected to the (2-1)th data line is configured to be charged by receiving a second color data signal of the second polarity, and another second color subpixel in the second horizontal line that is connected to the (3-1)th data line is configured to be charged by receiving a second color data signal of the first polarity.

11. The display device according to claim 8, wherein during a second horizontal period in which a gate-on voltage is applied to the second gate line, third color subpixels in the third horizontal line that are connected to the first and fifth data lines are configured to be charged by receiving third color data signals of a first polarity, and third color subpixels in the third horizontal line that are connected to the fourth and sixth data lines are configured to be charged by receiving third color data signals of a second polarity, respectively, and a second color subpixel in the second horizontal line that is connected to the (2-2)th data line is configured to be charged by receiving a second color data signal of the second polarity, and another second color subpixel in the second horizontal line that is connected to the (3-2)th data line is configured to be charged by receiving a second color data signal of the first polarity.

12. The display device according to claim 8, wherein each of the first to sixth data lines is configured to receive a data signal having a polarity opposite to a polarity of an adjacent data line, and wherein polarities of data signals applied to the each of the first to sixth data lines are all of a same polarity for one frame and are inverted for adjacent frames.

13. The display device according to claim 8, wherein each of the first to third color subpixels have a long side in the horizontal direction and a short side in the vertical direction.

14. A display device comprising:

first color subpixels arranged in a first row and disposed on a substrate;

second color subpixels arranged in a second row and disposed on the substrate;

third color subpixels arranged in a third row and disposed on the substrate;

a first gate line disposed between the first row and the second row, the first gate line being connected to the first color subpixels arranged in the first row and a first group of subpixels among the second color subpixels arranged in the second row;

a second gate line disposed between the second row and the third row, the second gate line being connected a second group of subpixels among the second color subpixels arranged in the second row and the third color subpixels arranged in the third row; and a controller connected to the first, second and third color subpixels, the controller being configured to:

drive the first, second and third color subpixels according to a two-dot inversion driving manner in a horizontal direction, and drive the first, second and third color subpixels according to a one-two-dot mixed-inversion driving manner in a vertical direction, the one-two-dot mixed-inversion driving manner including a one-dot inversion driving manner mixed with a two-dot inversion driving manner.

15. The display device according to claim 14, further comprising:

a first column of subpixels including a first-first color subpixel among the first color subpixels arranged in the first row, a first-second color subpixel among the second color subpixels arranged in the second row, and a first-third color subpixel among the third color subpixels arranged in the third row;

a second column of subpixels including a second-first color subpixel among the first color subpixels arranged in the first row, a second-second color subpixel among the second color subpixels arranged in the second row, and a second-third color subpixel among the third color subpixels arranged in the third row;

a first data line connected to the first-first color subpixel in the first column and the first-third color subpixel in the first column;

a second data line disposed between the first and second columns, the second data line being connected to first-second color subpixel in the first column and the second-second color subpixel in the second column; and a third data line connected to the second-first color subpixel in the second column and the second-third color subpixel in the second column.

16. The display device according to claim 15, wherein the controller is configured to:

supply a data voltage having a first polarity to the first data line, a data voltage having a second polarity opposite to the first polarity to the second data line and a data voltage having the first polarity to the third data line, during an odd frame, and supply a data voltage having the second polarity to the first data line, a data voltage having the first polarity the second data line and a data voltage having the second polarity to the third data line, during an even frame.

17. The display device according to claim 15, wherein the first and second gate lines overlap with a common electrode of at least one of the first, second and third color subpixels, and wherein the first, second and third data lines are spaced apart from and do not overlap with the common electrode.

18. The display device according to claim 14, further comprising:

a first column of subpixels including a first-first color subpixel among the first color subpixels arranged in the first row, a first-second color subpixel among the second color subpixels arranged in the second row, and a first-third color subpixel among the third color subpixels arranged in the third row;

a second column of subpixels including a second-first color subpixel among the first color subpixels arranged in the first row, a second-second color subpixel among the second color subpixels arranged in the second row, and a second-third color subpixel among the third color subpixels arranged in the third row;

a first data line connected to the first-first color subpixel in the first column and the first-third color subpixel in the first column;

a second data line disposed between the first and second columns, the second data line being connected to first-second color subpixel in the first column; and a third data line disposed between the first and second columns, the third data line being connected to second-second color subpixel in the second column.

19. The display device according to claim 18, wherein the controller is configured to:

supply a data voltage having a first polarity to the second data line, a data voltage having a second polarity opposite to the first polarity to the first data line and a data voltage having the second polarity to the third data line, during an odd frame, and supply a data voltage having the first polarity to the first data line, a data voltage having the second polarity the second data line and a data voltage having the first polarity to the third data line, during an even frame.

20. A display device comprising:

a first horizontal line including first color subpixels arranged in a horizontal direction;

a second horizontal line including second color subpixels arranged in the horizontal direction;

a third horizontal line including third color subpixels arranged in the horizontal direction;

a first gate line disposed between the first and second horizontal lines and connected to the first horizontal line and connected to some subpixels of the second horizontal line;

a second gate line disposed between the second and third horizontal lines and connected to the third horizontal line and connected to remaining subpixels of the second horizontal line;

column lines, each including alternating arrangements of the first to third color subpixels of the first to third horizontal lines in a vertical direction;

first type data line disposed on a first side of each of the column lines and connected to first and third color subpixels of each of the column lines; and second type data lines disposed on a second side of each of the column lines and connected to second color subpixels of each of the column lines, wherein the second type data line and the first type data line are disposed in parallel between adjacent column lines.

21. The display device according to claim 20, wherein the first type data lines include first type first, third, fifth, and sixth data lines disposed on a first side of each of first to fourth column lines and connected to first and third color subpixels of each of the first to fourth column lines.

22. The display device according to claim 21, wherein the second type data lines include:

second type (2-1)th and (2-2)th data lines disposed on a second side of each of the first and third column lines and connected to second color subpixels of each of the first and third column lines; and second type (4-1)th and (4-2)th data lines disposed on a second side of each of the second and fourth column lines and connected to second color subpixels of each of the second and fourth column lines, the (2-1)th data line is connected to the (2-2)th data line, and the (4-1)th data line is connected to the (4-2)th data line.

23. The display device according to claim 22, wherein, during a first horizontal period in which a gate-on voltage is driven in the first gate line, the first color subpixels, which are connected to the first and fifth data lines, of the first horizontal line are charged by receiving a first color data signal of a first polarity, and the first color subpixels connected to the third and sixth data lines are charged by receiving a first color data signal of a second polarity, and the second color subpixels, which are connected to the (2-1)th data line, of the first horizontal line are charged by receiving a second color data signal of a second polarity, and the second color subpixels connected to the (4-1)th data line are charged by receiving a second color data signal of a first polarity.

24. The display device according to claim 22, wherein, during a second horizontal period in which a gate-on voltage is driven in the second gate line, the second color subpixels, which are connected to the (2-2)th data line, of the third horizontal line are charged by receiving a second color data signal of a second polarity, and the second color subpixels connected to the (4-2)th data line are charged by receiving a second color data signal of a first polarity, and the third color subpixels, which are connected to the first and fifth data lines, of the second horizontal line are charged by receiving a third color data signal of a first polarity, and the third color subpixels connected to the third and sixth data lines are charged by receiving a third color data signal of a second polarity.

25. The display device according to claim 22, wherein the first, (4-1)th, and (4-2)th data lines apply data signals having a polarity opposite to that of the (2-1)th (2-2)th, third, and sixth data lines, and the polarity of the data signal applied to each of the first to sixth data lines is the same for one frame, and is reversed for each frame.

26. The display device according to claim 20, wherein the first to third horizontal lines are driven at a double rate by the first and second gate lines.

27. The display device according to claim 20, wherein the first to third color subpixels have a long side in the horizontal direction and a short side in the vertical direction.

* * * * *